(12) United States Patent
Kang et al.

(10) Patent No.: US 7,630,262 B2
(45) Date of Patent: Dec. 8, 2009

(54) ONE-TRANSISTOR TYPE DRAM

(75) Inventors: Hee Bok Kang, Cheongju-si (KR); Jin Hong An, Yongin-si (KR); Sung Joo Hong, Seoul (KR); Suk Kyoung Hong, Gwacheon-si (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 49 days.

(21) Appl. No.: 12/003,923

(22) Filed: Jan. 3, 2008

(65) Prior Publication Data
US 2009/0010079 A1  Jan. 8, 2009

(30) Foreign Application Priority Data
Jul. 4, 2007 (KR) .................. 10-2007-0067051
Jul. 4, 2007 (KR) .................. 10-2007-0067066

(51) Int. Cl.
*G11C 7/02* (2006.01)
(52) U.S. Cl. ........................ 365/210; 365/207
(58) Field of Classification Search .................. 365/210, 365/207, 149
See application file for complete search history.

(56) References Cited
U.S. PATENT DOCUMENTS
6,768,689 B2  7/2004  Origasa
6,982,908 B2  1/2006  Cho

| | | | |
|---|---|---|---|
| 7,027,334 B2 * | 4/2006 | Ikehashi et al. | 365/189.07 |
| 7,123,509 B2 * | 10/2006 | Ohsawa | 365/184 |
| 7,177,175 B2 * | 2/2007 | Fazan et al. | 365/149 |
| 7,251,163 B2 | 7/2007 | O | |
| 7,317,646 B2 | 1/2008 | Yoon et al. | |
| 7,388,798 B2 | 6/2008 | Kim et al. | |
| 2007/0140029 A1 | 6/2007 | Kim et al. | |
| 2007/0241405 A1 * | 10/2007 | Popoff | 257/351 |

FOREIGN PATENT DOCUMENTS
KR  1020010061369 A1  7/2001

* cited by examiner

*Primary Examiner*—Anh Phung
(74) *Attorney, Agent, or Firm*—IP & T Law Firm PLC

(57) ABSTRACT

A one-transistor type DRAM includes a floating body storage element connected between a bit line and a source line and controlled by a word line. The DRAM comprises a plurality of source lines and word lines arranged in a row direction, a plurality of bit lines arranged in a column direction, a plurality of reference bit lines arranged in a column direction, a cell array including the floating body storage element and formed in a region where the source line, the word line and the bit line are crossed, a reference cell array including the floating body storage element, formed in a region where the source line, the word line and the bit line are crossed and configured to output a reference current having a plurality of levels, a plurality of reference voltage generating units connected to the reference bit lines and configured to generate a plurality of reference voltages corresponding to the reference current having a plurality of levels, and a sense amplifier and a write driving unit connected to the bit line and configured to receive the plurality of reference voltages.

11 Claims, 19 Drawing Sheets

DATA "1" STORAGE STATE

DATA "0" STORAGE STATE

ONE-TRANSISTOR TYPE DRAM

RELATED APPLICATIONS

This application claims the benefit of priority to Korean patent application numbers 10-2007-0067051 and 10-2007-0067066, both filed on Jul. 4, 2007, the entire contents of which are incorporated herein by reference.

TECHNICAL FIELD

The present invention relates generally to a one-transistor type dynamic random access memory (DRAM), and more specifically, to a one-transistor type DRAM including a reference cell array with a floating body storage element to generate a reference voltage that reflects write and data retaining characteristics of a main cell.

BACKGROUND

Generally, a semiconductor device, such a DRAM, is integrated over a silicon wafer. However, in the silicon wafer used in the semiconductor device, the whole silicon is not used in the operation of the device, but a limited thickness of the device, e.g. several μm from the surface is used. As a result, the rest silicon wafer except a portion required in the operation of the device increases power consumption and degrades a driving speed.

A Silicon On Insulator (SOI) wafer has been required which includes an insulating layer in a silicon substrate to obtain a silicon single crystal layer having thickness of several μm. In a semiconductor device integrated in the SOI wafer, a smaller junction capacity facilitates high speed operation in comparison with a semiconductor device integrated in a general silicon wafer, and a low voltage due to a low threshold satisfies high speed operation and low voltage.

However, the sensing efficiency of the sense amplifier is degraded when a reference voltage of an integrated semiconductor device in the SOI wafer is not effectively controlled. As a result, a data sensing margin and a yield of the chip are degraded. Furthermore, a conventional one-transistor type DRAM cell cannot store multi level data not to perform effective read/write operations.

SUMMARY

Consistent with the present invention, there is provided a one-transistor type DRAM including a floating body storage element connected between a bit line and a source line and controlled by a word line, the DRAM comprising a plurality of source lines and word lines arranged in a row direction, a plurality of bit lines arranged in a column direction, a plurality of reference bit lines arranged in the column direction, a cell array including the floating body storage element and formed in a region where the source line, the word line and the bit line are crossed, a reference cell array including the floating body storage element, formed in a region where the source line, the word line and the bit line are crossed and configured to output a reference current having a plurality of levels, a plurality of reference voltage generating units connected to the reference bit lines and configured to generate a plurality of reference voltages corresponding to the reference current having a plurality of levels, and a sense amplifier and a write driving unit connected to the bit line and configured to receive the plurality of reference voltages.

Consistent with the present invention, there is also provided a one-transistor type DRAM including a floating body storage element connected between a bit line and a source line and controlled by a word line, the DRAM comprising a plurality of source lines and word lines arranged in a row direction, a plurality of bit lines arranged in a column direction, a pair of reference bit lines arranged in a column direction, a cell array including the floating body storage element and formed in a region where the source line, the word line and the bit line are crossed, a reference cell array including the floating body storage element and formed in a region where the source line, the word line and the pair of reference bit line are crossed so as to output a different reference current, a reference voltage generating unit connected to the pair of reference bit lines and configured to generate a reference voltage corresponding to the different reference current, and a sense amplifier and a write driving unit connected to the bit line and configured to receive the reference voltage.

Consistent with the present invention, there is also provided a one-transistor type DRAM including a floating body storage element connected between a bit line and a source line and controlled by a word line, the DRAM comprising a plurality of bit lines arranged in a column direction, a first reference bit line arranged in a column direction, a second reference bit line arranged in a column direction, a reference voltage generating unit connected to the first reference bit line and the second reference bit line, and a sense amplifier and a write driving unit connected to the plurality of bit lines and configured to receive a reference voltage, wherein the reference voltage generating unit averages a reference current flowing in the first reference bit line and the second reference bit line.

Consistent with the present invention, there is also provided a one-transistor type DRAM including a floating body storage element connected between a bit line and a source line and controlled by a word line, the DRAM comprising a plurality of bit lines arranged in a column direction, a first reference bit line arranged in a column direction, a second reference bit line arranged in a column direction, a third reference bit line arranged in a column direction, a fourth reference bit line arranged in a column direction, a first reference voltage generating unit connected to the first reference bit line and the second reference bit line, a second reference voltage generating unit connected to the third reference bit line and the fourth reference bit line, and a sense amplifier and a write driving unit connected to the plurality of bit lines and configured to receive a plurality of reference voltages, wherein the first reference voltage generating unit averages a reference current flowing in the first reference bit line and the second reference bit line to output a first reference voltage, and the second reference voltage generating unit averages a reference current flowing in the third reference bit line and the fourth reference bit lint to output a second reference voltage.

DETAILED DESCRIPTION

Figure 1:
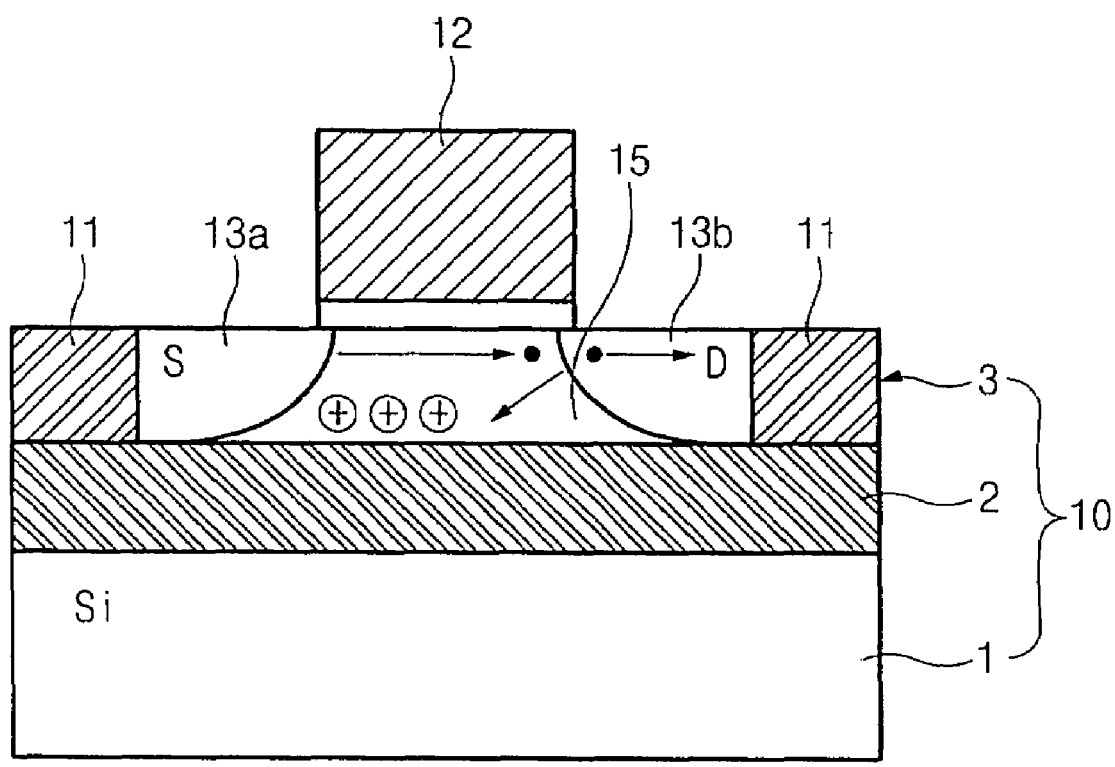
FIG. 1 is a sectional view illustrating a unit cell of a one-transistor type DRAM according to an embodiment consistent with the present invention.

FIG. 1 is a sectional view illustrating a unit cell of a one-transistor type DRAM according to an embodiment consistent with the present invention.

A silicon-on-insulator (SOI) wafer 10, which may have a stacked structure, includes a silicon substrate 1, a buried oxide layer 2, and a silicon layer 3. A device isolation pattern 11 may be formed in silicon layer 3 of SOI wafer 10 to define an active region. In one embodiment, device isolation pattern 11 may contact buried oxide layer 2.

A gate 12 is formed over the active region of silicon layer 3. Source/drain regions 13a and 13b are formed in silicon layer 3 and at both sides of gate 12. In one embodiment, source/drain regions 13a and 13b may contact buried oxide film 2.

A DRAM cell may be formed in SOI wafer 10. To store data in the DRAM cell, holes and electrons may be captured in a floating body 15, which corresponds to a channel region under gate 12.

Figure 2A:
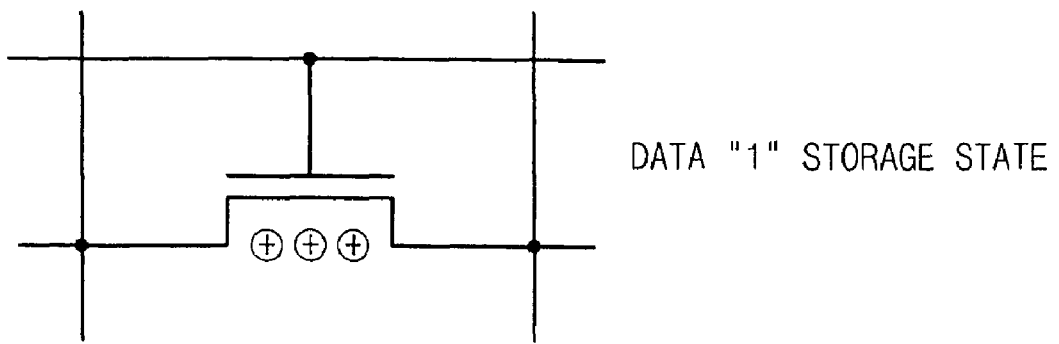
FIGS. 2a and 2b schematically illustrate a cell data storage state of a one-transistor type DRAM according to an embodiment consistent with the present invention.
Figure 2B:
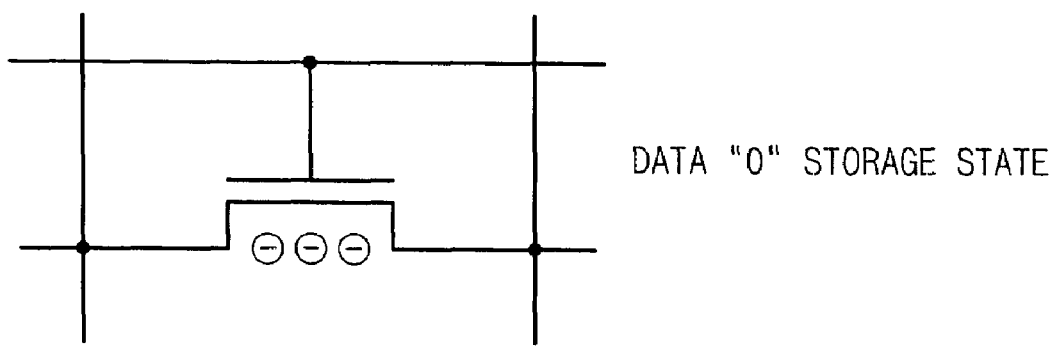

Referring to FIG. 2a, in one embodiment, data "1" storage state may mean that holes are captured in floating body 15. Referring to FIG. 2b, in one embodiment, data "0" storage state may mean that electrons are captured in floating body 15. It is to be understood that data "1" storage state and data "0" storage state may be differentiated by having relatively more holes captured in floating body 15 to represent data "1" storage state and relatively less holes captured in floating body 15 to represent data "0" storage state. Alternatively, relatively more electrons captured in floating body 15 may represent data "0" storage state, while relatively less electrons captured in floating body 15 may represent data "1" storage state.

Figure 3A:
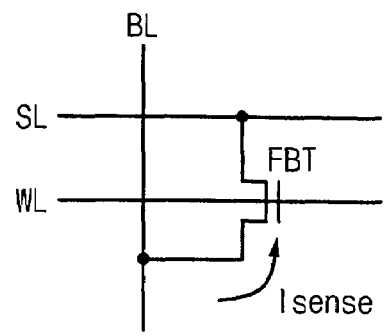
FIG. 3a is a circuit diagram schematically illustrating a unit cell of a one-transistor type DRAM according to an embodiment consistent with the present invention.

FIG. 3a is a circuit diagram schematically illustrating a unit cell of a one-transistor type DRAM according to an embodiment consistent with the present invention.

As shown in FIG. 3a, the unit cell of the one-transistor type DRAM includes a floating body transistor FBT having a source 13a connected to a source line SL, a drain 13b connected to a bit line BL, and a gate 12 connected to a word line WL.

Figure 3B:
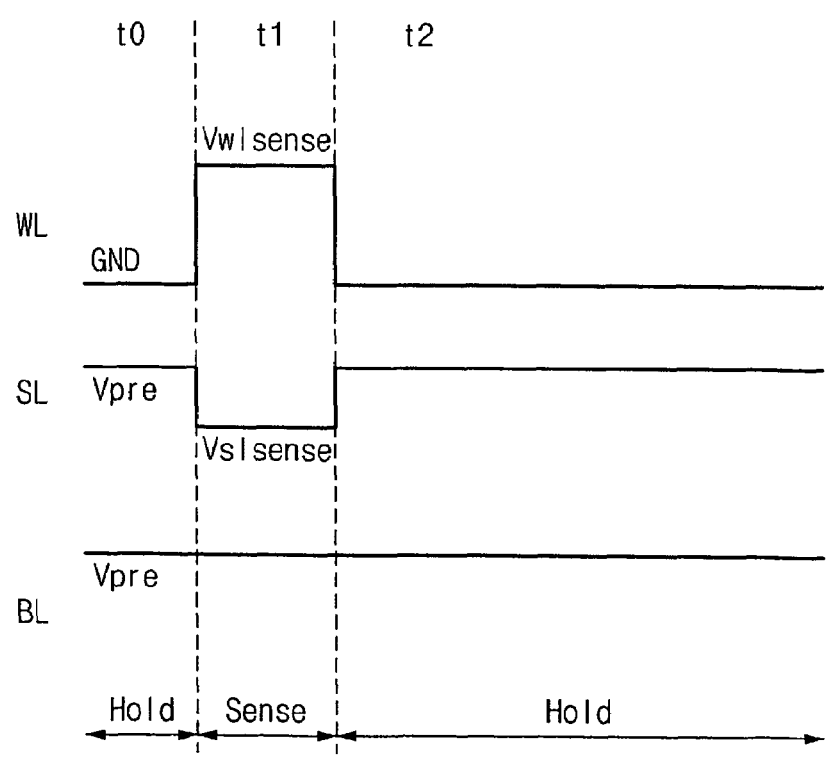
FIG. 3b is a timing diagram illustrating a process for reading the unit cell shown in FIG. 3a consistent with the present invention.

FIG. 3b is a timing diagram illustrating a process for reading the one-transistor type DRAM shown in FIG. 3a.

As shown in FIG. 3b, the timing diagram may include time periods t0~t2. In time periods t0 and t2, data may be retained in the unit cell. In time period t1, data may be read from the unit cell.

In time period t0, that is, in a first hold period, word line WL is coupled to a ground GND, while source line SL and bit line BL are coupled to a precharge voltage Vpre. In time period t0, data may be retained in floating body 15 of the unit cell.

In time period t1, word line WL is coupled to a word line sensing voltage Vwlsense to read data stored in the unit cell. In time period t1, source line SL is coupled to a source line sensing voltage Vslsense, and bit line BL is maintained at precharge voltage Vpre. As a result, a sensing current Isense may be generated to flow from bit line BL to source line SL.

That is, a drain source voltage Vds corresponding to sensing current Isense may be formed between bit line BL and source line SL to read data in the unit cell.

In time period t2, that is, in a second hold period, word line WL is coupled to ground GND, source line SL is coupled to precharge voltage Vpre, and bit line BL is maintained at precharge voltage Vpre.

In one embodiment, word line sensing voltage Vwlsense may be a positive voltage, that is, a voltage greater than that of ground GND. In one embodiment, source line sensing voltage Vslsense may be less than precharge voltage Vpre, but greater than the voltage of ground GND.

Figure 4:
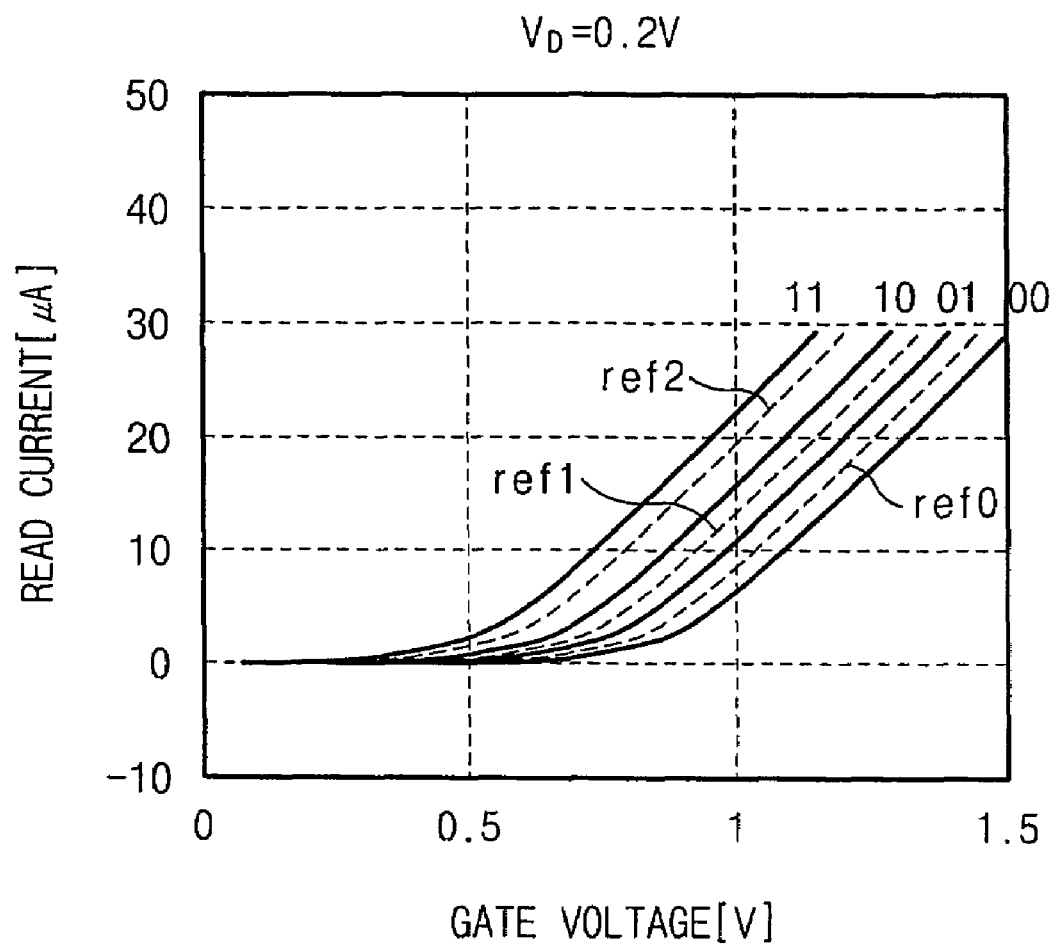
FIG. 4 is a diagram illustrating a cell read current of a one-transistor type DRAM according to an embodiment consistent with the present invention.

FIG. 4 is a diagram illustrating a cell read current of a one-transistor type DRAM according to an embodiment consistent with the present invention.

The cell read current, as shown in FIG. 4, may be obtained by applying to gate 12 a cell gate voltage of about 0. Volts to about 1.5 Volts, applying to drain 13b a cell drain voltage Vd of about 0.2 Volts, and grounding source 13a. In this particular embodiment, two-bit-data may be stored in the unit cell of the one-transistor DRAM by using four level currents.

When word line sense voltage Vwlsense is applied to word line WL, sensing current Isense flows from bit line BL to source line SL. Data "11" may be read when sensing current Isense is greater than a second reference current ref2. Data "10" may be read when sensing current Isense is greater than a first reference current ref1 and less than second reference current ref2. Data "01" may be read when sensing current Isense is greater than a zeroth reference current ref0 and less than first reference current ref1. Data "00" may be read when sensing current Isense is less than zeroth reference current ref0.

The current level for data "11" is the highest, and the current level for data "10" is lower than that of data "11." The current level for data "01" is lower than that of data "10," and the current level for data "00" is lower than that of data "01." Values of reference currents ref0, ref1, ref2 may be predetermined among the four current levels, so as to read multi-level data from the unit cell of the one-transistor type DRAM.

Figure 5:
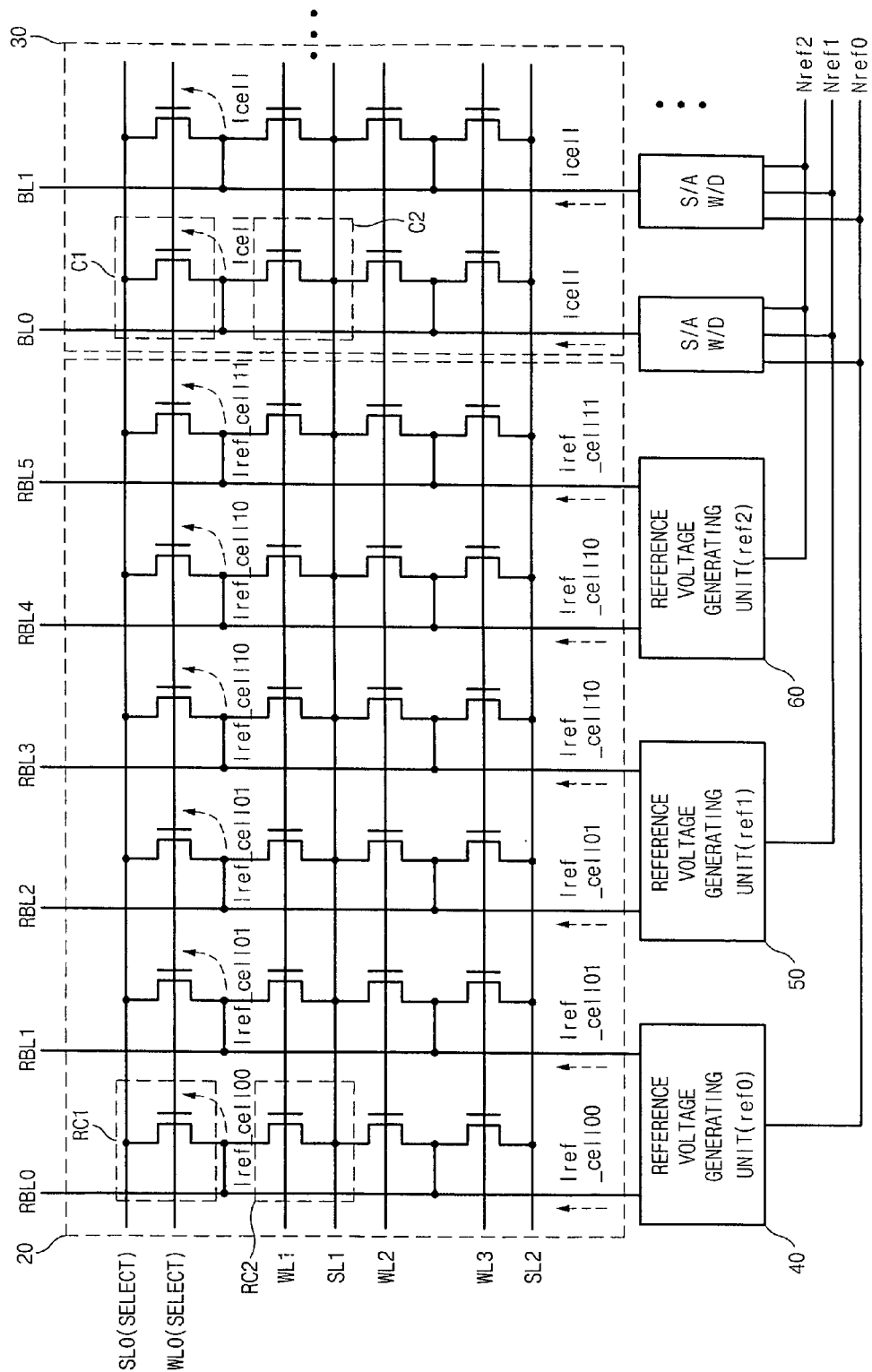
FIGS. 5 and 6 are circuit diagrams schematically illustrating a one-transistor type DRAM according to an embodiment consistent with the present invention.

FIG. 5 is a circuit diagram schematically illustrating a one-transistor type DRAM according to an embodiment consistent with the present invention. The one-transistor type DRAM shown in FIG. 5 may store two-bit-data using four level currents.

As shown in FIG. 5, the one-transistor type DRAM may comprise a reference cell array 20, a cell array 30, a plurality of reference voltage generating units 40, 50, and 60, a sense amplifier S/A, and a write driving unit W/D.

Reference cell array 20 includes a plurality of source lines SL0~SL2 and a plurality of word lines WL0~WL3 which are arranged in a row direction. A plurality of reference bit lines RBL0~RBL5 are arranged in a column direction. Reference cell array 20 includes reference cells RC1, RC2 that reflects a characteristic of a main cell to generate a plurality of reference voltages Nref0~Nref2, thereby increasing efficiency of the sense amplifier.

Reference cells RC1, RC2, connected between the source line SL0 and source line SL1, have a common drain to share the reference bit line RBL0. Reference cells RC1, RC2 have a gate connected to the word lines WL0, WL1, respectively. Reference cells RC1, RC2 arranged up and down have a source connected to the different source lines SL0, SL1.

Three pairs of the cell included in reference cell array 20 are arranged in a row direction. Reference cell RC is formed based on six columns. Each column cell may store different data.

For example, the reference cells RC1, RC2 connected to the reference bit line RBL0 write data "00" simultaneously as when data of main cells C1, C2 are written. As a result, a reference current Iref_cell00 corresponding to data "00" may flow in to reference bit line RBL0.

Reference cells connected to reference bit line RBL1 write data "01" simultaneously as when the data of main cells are written. As a result, a reference current Iref_cell01 corresponding to the data "01" may flow in to reference bit line RBL1.

The reference cells connected to reference bit line RBL2 write the data "01" simultaneously as when the data of main cells are written. As a result, the reference current Iref_cell01 corresponding to the data "01" may flow in to reference bit line RBL2.

The reference cells connected to the reference bit line RBL3 write the data "10" simultaneously as when the data of main cells are written. As a result, a reference current Iref_cell10 corresponding to data "10" may flow in to reference bit line RBL3.

The reference cells connected to the reference bit line RBL4 write the data "10" simultaneously as when the data of main cells are written. As a result, reference current Iref_cell10 corresponding to the data "10" may flow in to reference bit line RBL4.

The reference cells connected to reference bit line RBL5 may write the data "11" simultaneously as when the data of main cells are written. As a result, a reference current Iref_cell11 corresponding to data "11" may flow in to reference bit line RBL5.

Reference cell array 20 has the same cell structure in order to maintain the same characteristic as that of main cell array 30. Also, the write timing is controlled to have the same condition. A sensing current of reference cell RC to write data "00" is set to have the same value as that of a sensing current of the main cell C to write data "00".

A sensing current of reference cell RC to write data "01" is set to have the same value as that of a sensing current of the main cell C to write the data "01". A sensing current of reference cell RC to write the data "10" is set to have the same value as that of a sensing current of main cell C to write data "10". A sensing current of reference cell RC to write data "11" is set to have the same value as that of a sensing current of main cell C to write data "11".

Cell array 30 includes a plurality of source lines SL0~SL2 and a plurality of word lines WL0~WL3 arranged in a row direction. A plurality of bit lines BL0, BL1 are arranged in a column direction.

In cell array 30, the cells C1, C2 connected between the source lines SL0 and SL1 have a common drain that shares bit line BL0. Gates of the cells C1, C2 are connected to word lines WL0, WL1, respectively. Sources of the cells C1, C2 arranged up and down are connected to different source lines SL0, SL1.

The source line sensing voltage Vslsense, which is a sensing bias voltage for sensing a sensing current of the cell, is applied between bit line BL and source line SL. As a result, cell sensing current Icell flows depending on a storage state of cell data.

Reference voltage generating units 40~60 are connected one-by-one to the reference bit lines RBL0~RBL5 in order to generate a reference current of the sense amplifier S/A. Reference voltage generating units 40~60 control the reference currents Iref_cell00~Iref_cell11 flowing in to reference bit lines RBL0~RBL5 to generate a plurality of reference voltages Nref0~Nref2.

Reference bit lines RBL0~RBL5 may be paired and connected to reference voltage generating units 40~60. That is, reference voltage generating unit 40 connected to reference bit lines RBL0, RBL1 may generate the reference voltage Nref0 depending on reference currents Iref_cell00, Iref_cell01. Reference voltage generating unit 50 connected to reference bit lines RBL2, RBL3 may generate reference voltage Nref1 depending on reference currents Iref_cell01, Iref_cell10. Reference voltage generating unit 60 connected to reference bit lines RBL4, RBL5 may generate reference voltage Nref2 depending on reference currents Iref_cell10, Iref_cell11.

Bit line BL0, BL1 may be connected one-by-one to sense amplifier S/A and write driving unit W/D. Sense amplifier S/A and write driving unit W/D receive reference voltages Nref0~Nref2 to control cell current Icell.

Sense amplifier S/A senses the cell data to distinguish the data "11", the data "10", the data "01", the data "00". Write driving unit W/D supplies a driving voltage corresponding to write data to bit line BL when data are written in the cell.

Figure 6:
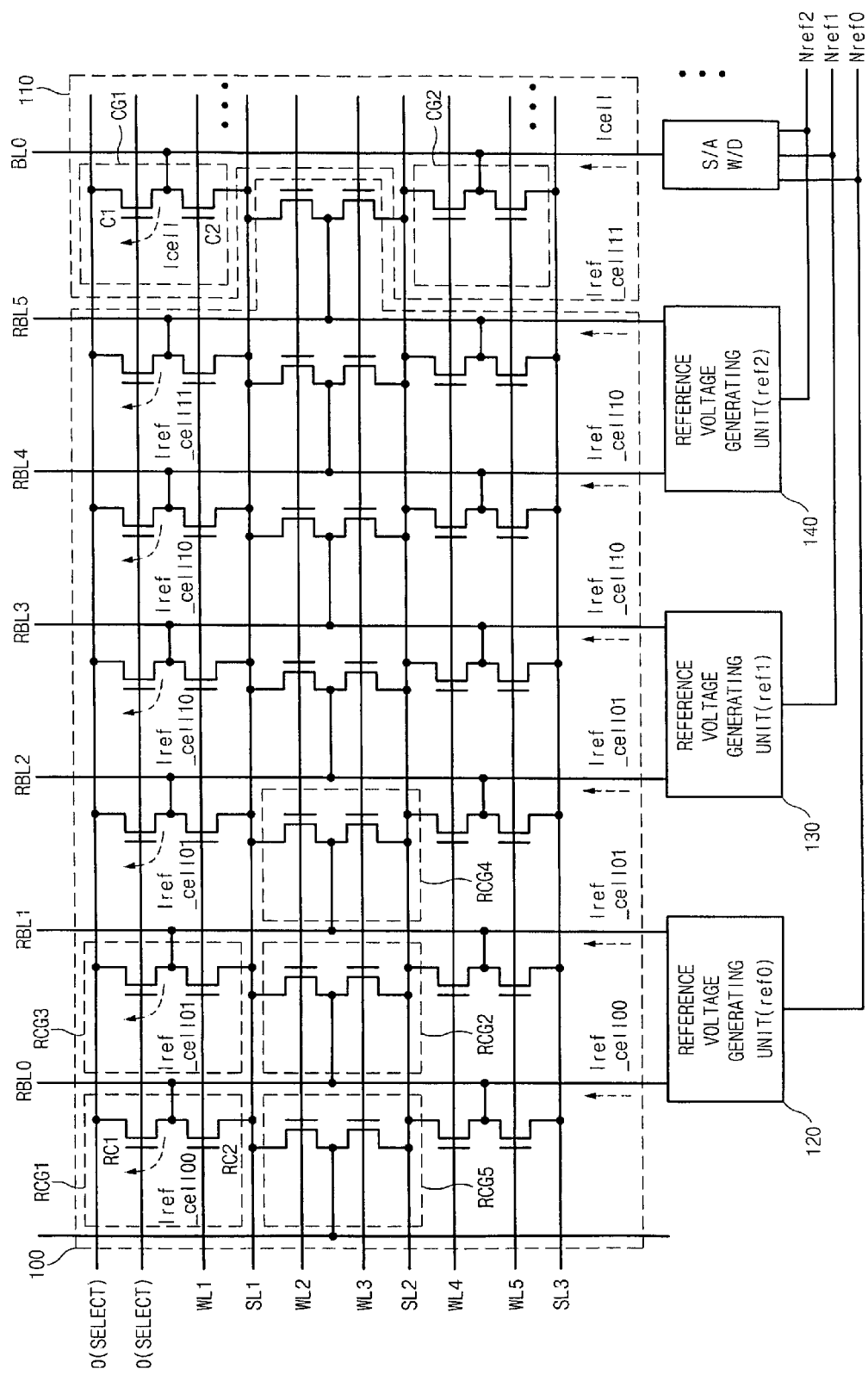

FIG. 6 is a circuit diagrams illustrating a one-transistor type DRAM according to an embodiment consistent with the present invention. The embodiment of FIG. 6 is an example of 2 bit data being stored using 4 level currents.

The one-transistor type DRAM of FIG. 6 may comprise a reference cell array 100, a cell array 110, a plurality of reference voltage generating units 120~140, a sense amplifier S/A and a write driving unit W/D.

Reference cell array 100 includes a plurality of source lines SL0~SL3 and a plurality of word lines WL0~WL5 which are arranged in a row direction. A plurality of reference bit lines RBL0~RBL5 are arranged in a column direction. Reference cell array 100 includes reference cells RC1, RC2 that reflect characteristics of the main cell to generate a plurality of reference voltages Nref0~Nref2, thereby increasing efficiency of the sense amplifier.

In reference cell array 100, reference cells RC1, RC2, connected between the source line SL0 and source line SL1, have a common drain to share reference bit line RBL0. Reference cells RC1, RC2 have a gate connected to word lines WL0, WL1, respectively. Reference cells RC1, RC2 arranged up and down have a source connected to different source lines SL0, SL1.

Three pairs of the cell included in reference cell array 20 are arranged in a row direction. Reference cell RC is formed based on six columns. Each of column cells stores different data.

For example, reference cells RC1, RC2 connected to reference bit line RBL0 write the data "00" simultaneously as when the data of main cells C1, C2 are written. As a result, a reference current Iref_cell00 corresponding to the data "00" may flow in to reference bit line RBL0.

The reference cells connected to reference bit line RBL1 write data "01" simultaneously as when the data of main cells are written. As a result, a reference current Iref_cell01 corresponding to data "01" may flow in to reference bit line RBL1.

The reference cells connected to reference bit line RBL2 write the data "01" simultaneously as when the data of main cells are written. As a result, reference current Iref_cell01 corresponding to the data "01" may flow in to reference bit line RBL2.

The reference cells connected to reference bit line RBL3 write the data "10" simultaneously as when the data of main cells are written. As a result, a reference current Iref_cell10 corresponding to the data "10" may flow in to reference bit line RBL3.

The reference cells connected to reference bit line RBL4 write the data "10" simultaneously as when the data of main cells are written. As a result, the reference current Iref_cell10 corresponding to the data "10" may flow in to reference bit line RBL4.

The reference cells connected to reference bit line RBL5 write the data "11" simultaneously as when the data of main cells are written. As a result, a reference current Iref_cell11 corresponding to the data "11" may flow in to reference bit line RBL5.

Reference cell array 100 has the same cell structure in order to maintain the same characteristic as that of main cell array 100. Also, the write timing is controlled to have the same condition. A sensing current of the reference cell RC to write the data "00" is set to have the same value as that of a sensing current of the main cell C to write the data "00".

A sensing current of reference cell RC to write the data "01" is set to have the same value as that of a sensing current of the main cell C to write the data "01". A sensing current of the reference cell RC to write the data "10" is set to have the same value as that of a sensing current of the main cell C to write the data "10". A sensing current of reference cell RC to write the data "11" is set to have the same value as that of a sensing current of the main cell C to write data "11".

Cell array 110 includes a plurality of source lines SL0~SL3 and a plurality of word lines WL0~WL5 arranged in a row direction. A plurality of bit lines BL0, BL1 may be arranged in a column direction.

In cell array 110, cells C1, C2 connected between source lines SL0 and SL1 have a common drain that shares bit line BL0. Gates of cells C1, C2 are connected to word lines WL0, WL1, respectively. Sources of cells C1, C2 arranged up and down are connected to different source lines SL0, SL1.

Source line sensing voltage Vslsense, which is a sensing bias voltage for sensing a sensing current of the cell, is applied between bit line BL and source line SL. As a result, cell sensing current Icell flows depending on a storage state of cell data.

Reference voltage generating units 120~140 are connected to reference bit lines RBL0~RBL5 in order to generate a reference current of sense amplifier S/A. Reference voltage generating units 120~140 control reference currents Iref_cell00~Iref_cell11 flowing in reference bit lines RBL0~RBL5 to generate a plurality of reference voltages Nref0~Nref2.

Reference bit lines RBL0~RBL5 are paired and connected to reference voltage generating units 120~140. That is, reference voltage generating unit 120 connected to reference bit lines RBL0, RBL1 generates reference voltage Nref0 depending on reference currents Iref_cell00, Iref_cell01. Reference voltage generating unit 130 connected to reference bit lines RBL2, RBL3 generates reference voltage Nref1 depending on reference currents Iref_cell01, Iref_cell10. Reference voltage generating unit 140 connected to reference bit lines RBL4, RBL5 generates reference voltage Nref2 depending on reference currents Iref_cell10, Iref_cell11.

Bit line BL0, BL1 are connected one-by-one to sense amplifier S/A and write driving unit W/D. Sense amplifier S/A and write driving unit W/D receive reference voltages Nref0~Nref2 for distinguishing sensing voltages to control cell current Icell.

Sense amplifier S/A senses the cell data to distinguish the data "11", the data "10", the data "01", the data "00". Write driving unit W/D supplies a driving voltage corresponding to write data to bit line BL when data are written in the cell.

Reference cell array 100 includes a plurality of reference cell groups RCG connected to the plurality of reference bit lines RBL. Cell array 110 includes a plurality of cell groups CG connected to bit line BL.

Reference cell groups RCG1, RCG2 connected to reference bit line RBL0 are alternately arranged in row and column directions.

Reference cell groups RCG3, RCG4 connected to reference bit line RBL1 are alternately arranged in row and column directions. A plurality of cell groups CG1, CG2 connected to bit line BL are arranged alternately in row and column directions.

Source line SL1 is shared by reference cell groups RCG1, RCG2 arranged up and down. Reference cell groups RCG1, RCG3 arranged in the same row line are shared by source line SL1.

Reference cell groups CCG2, CCG3 arranged up and down based on source line SL1 from reference cell groups RCG2, RCG3 arranged in the same column line are connected to reference bit lines RBL0 or RBL1. That is, reference cell group RCG3 arranged over source line SL1 is connected to reference bit line RBL1, and reference cell group RCG2 arranged below source line SL1 is connected to reference bit line RBL0.

When several cells arranged up and down share the same bit line, a bias voltage is applied to bit line BL while source line SL1 is shared in a write mode. The same voltage is applied to floating body cells arranged up and down. As a result, the same bias voltage is applied to selected cells and unselected cells so that an operating error occurs in the unselected cells.

Cell groups CG3, CG2 arranged up and down are connected to reference bit lines RBL1, RBL0. The bias voltage is applied to the selected cells, and the bias voltage from the bit line is not applied in the unselected cells, thereby preventing an operating error of the cell.

A reference cell group RCG5 is not connected to reference bit line RBL, but is disposed in the cell array to make process be convenience. A bias condition applied to each cell can be differentiated by changing the arrangement of the cell groups as shown in FIG. 6.

Figure 7:
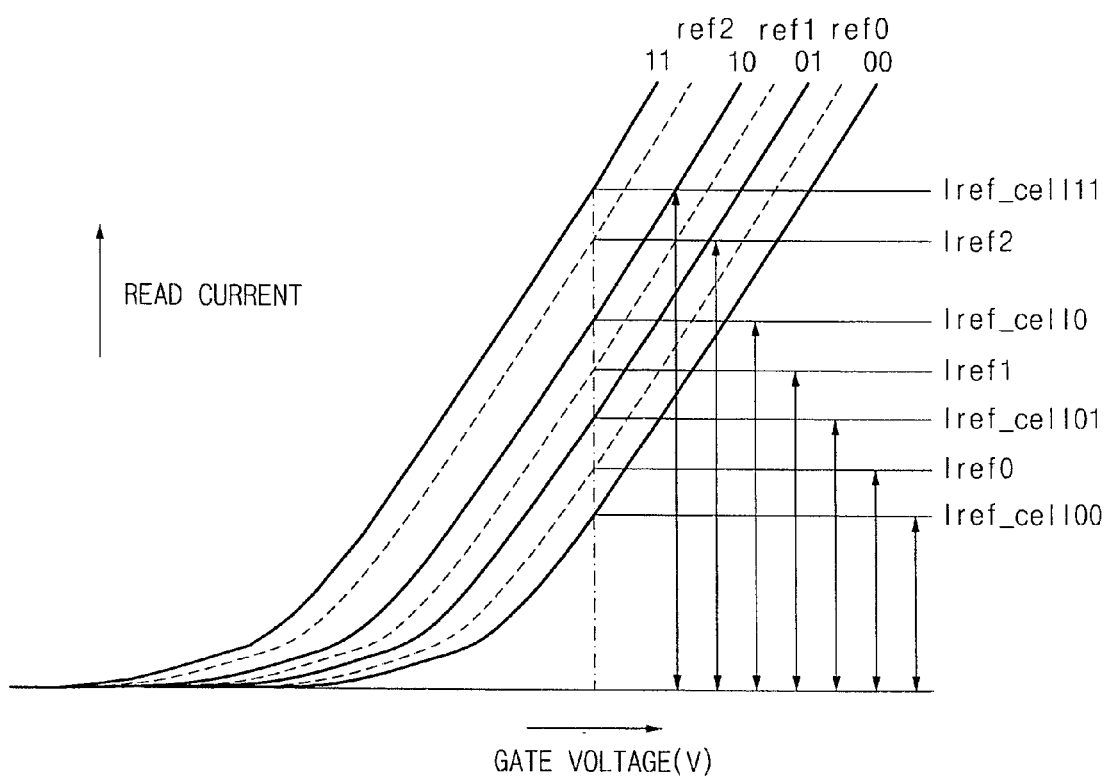
FIG. 7 is a diagram illustrating a reference current of a one-transistor type DRAM according to an embodiment consistent with the present invention.

FIG. 7 is a waveform diagram illustrating a multi reference current of a one-transistor type DRAM according to an embodiment consistent with the present invention.

In sensing period t1 of FIG. 4b, when the voltage of word line WL transits to word line sensing voltage Vwlsense level, the reference current Iref_cell00 identical with a current Icell00 corresponding to the data "00" of the main cell C1, C2 flows in reference cells RC1, RC2 connected to reference bit line RBL0.

Reference current Iref_cell01 identical with a current Icell01 corresponding to data "01" of the main cell flows in the reference cell connected to reference bit line RBL1. As a result, the reference voltage generating unit 40 generates a reference current Iref0 corresponding to a middle value of the currents Icell00 and Icell01 of main cell.

Values of the reference currents Iref_cell00 and Iref_cell01 are averaged. That is, the values of reference currents Iref_cell00 and Iref_cell01 are added and divided by 2. As a result, reference current Iref0 has a current value corresponding to the middle value of the currents Icell00 and Icell01 of main cell.

Reference current Iref_cell10 identical with a current Icell10 corresponding to the data "10" of the main cell flows in reference cell connected to reference bit line RBL3. Reference current Iref_cell01 identical with a current Icell01 corresponding to the data "01" of the main cell flows in the reference cell connected to reference bit line RBL2. As a result, reference voltage generating unit 50 generates a reference current Iref1 corresponding to a middle value of currents Icell01 and Icell10.

Values of reference currents Iref_cell01 and Iref_cell10 are averaged. That is, the values of reference currents Iref_cell01 and Iref_cell10 are added and divided by 2. As a result, reference current Iref1 has a current value corresponding to the middle value of currents Icell01 and Icell10.

Reference current Iref_cell11 identical with a current Icell11 corresponding to the data "11" of the main cell flows in the reference cell connected to reference bit line RBL5. Reference current Iref_cell10 identical with a current Icell10 corresponding to the data "10" of the main cell flows in the reference cell connected to reference bit line RBL4. As a result, reference voltage generating unit 60 generates a reference current Iref2 corresponding to a middle value of currents Icell10 and Icell11.

Values of reference currents Iref_cell10 and Iref_cell11 are averaged. That is, the values of reference currents Iref_cell10 and Iref_cell11 are added and divided by 2. As a result, reference current Iref2 has a current value corresponding to the middle value of currents Icell10 and Icell11.

Figure 8:
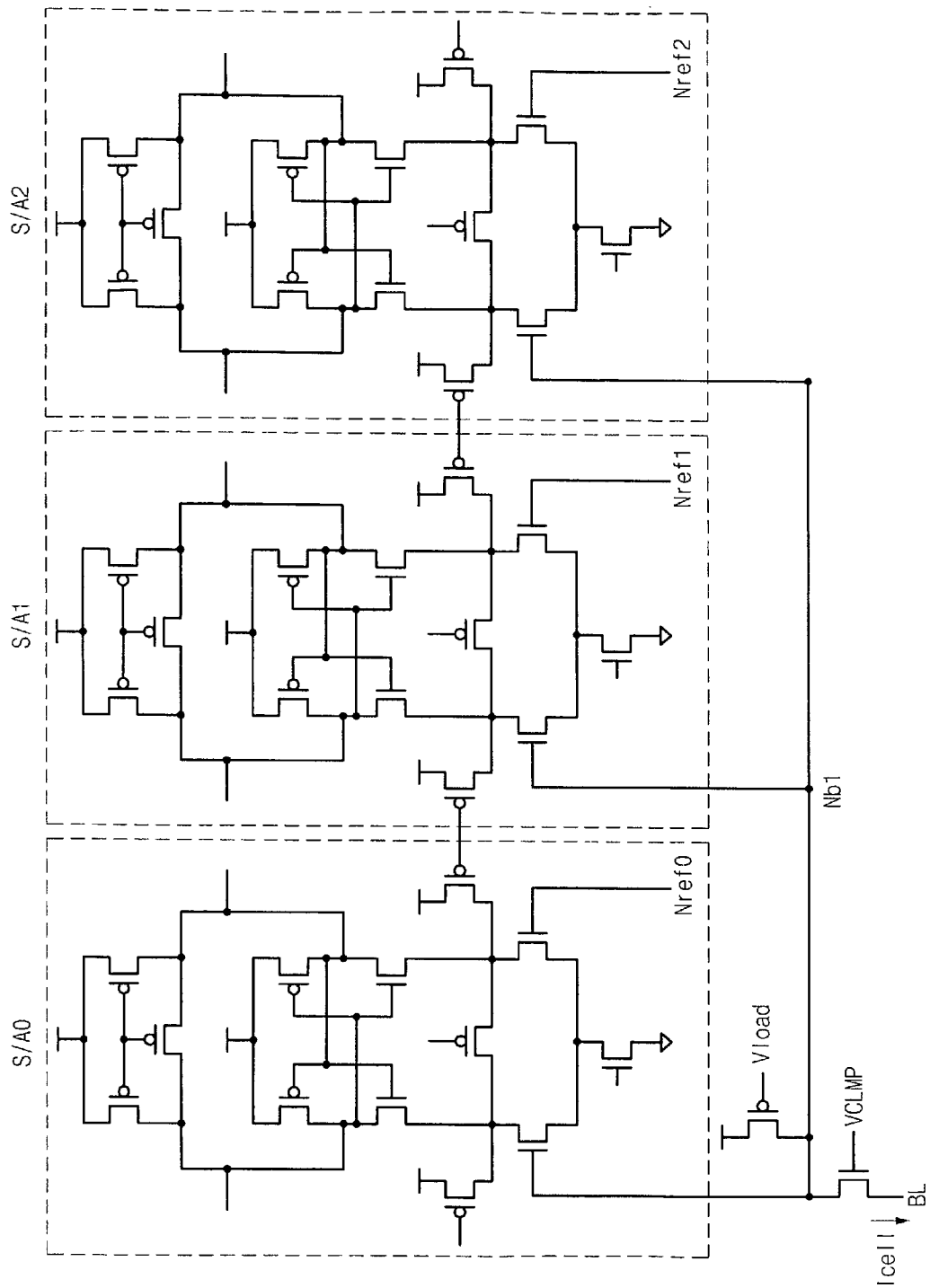
FIG. 8 is a circuit diagram schematically illustrating a plurality of sense amplifiers of the one-transistor type DRAM shown in FIGS. 5 and 6 consistent with the present invention.

FIG. 8 is a circuit diagram illustrating the current sense amplifiers S/A0~S/A2 of FIGS. 5 and 6.

Three sense amplifiers S/A0~S/A2 are required to sense 4 level currents. Sense amplifiers S/A0~S/2 receive a signal of a node Nbl in common, and different reference voltages Nref0~Nref2. Bit line current Icell of the main cell is controlled by a clamp element and a load element. The node Nbl terminal generates a signal voltage of the main cell.

Figure 9:
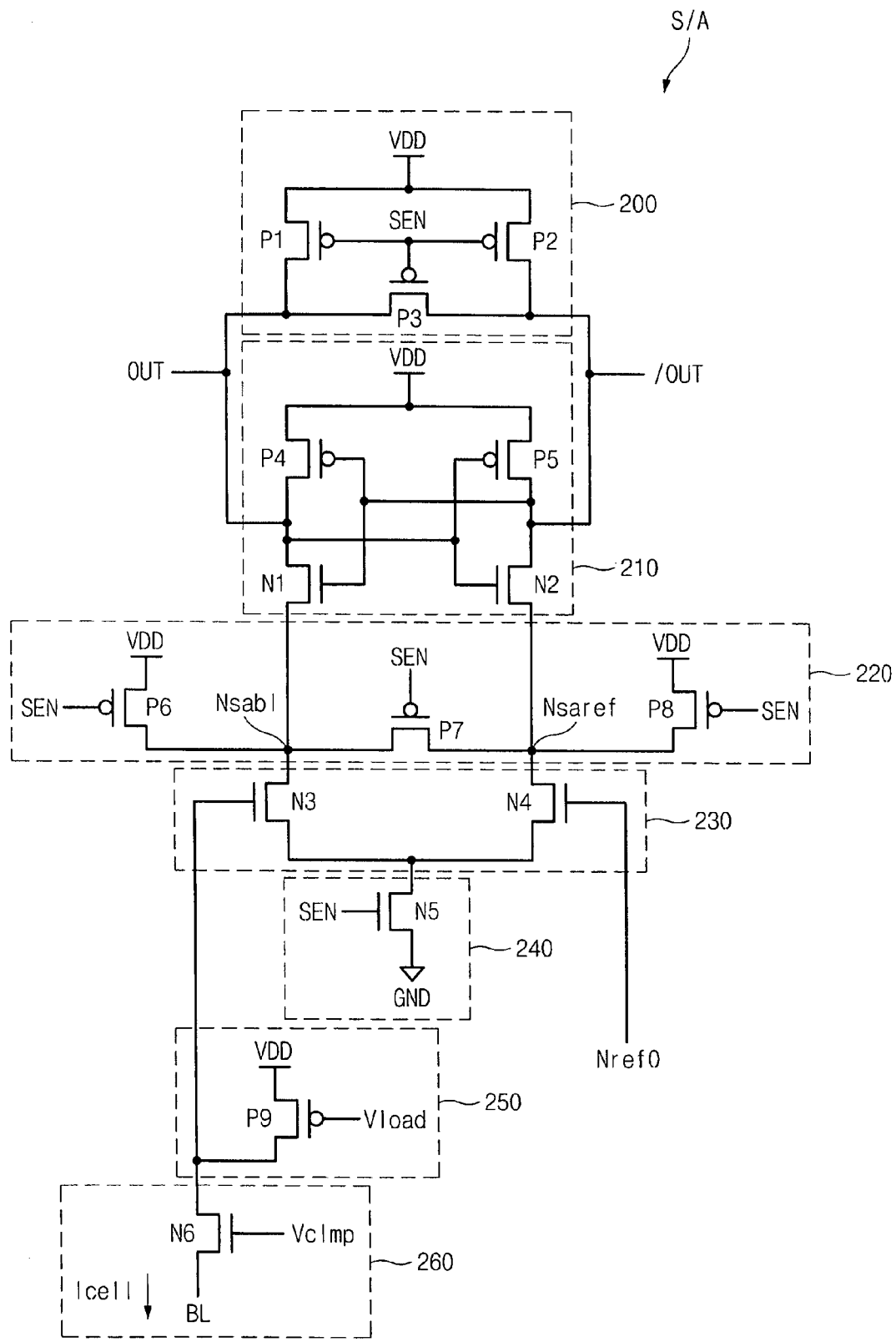
FIG. 9 is a circuit diagram schematically illustrating one of the sense amplifiers shown in FIG. 8 consistent with the present invention.

FIG. 9 is a circuit diagram illustrating the current sense amplifiers S/A0 of FIG. 8.

Sense amplifier S/A includes an equalizing unit 200, an amplifying unit 210, a pull-up unit 220, an amplifying unit 230, an amplifying activation control unit 240, a current sensing load unit 250 and a bit line voltage bias control unit 260.

Equalizing unit 200 includes PMOS transistors P1~P3. PMOS transistor P1 is connected between power voltage VDD terminal and an output terminal OUT. PMOS transistor P2 is connected between power voltage VDD terminal and an output terminal /OUT. PMOS transistor P3 is connected between output terminals OUT, /OUT. PMOS transistors P1~P3 have a common gate to receive a sense amplifier enable signal SEN.

Amplifying unit 210 includes PMOS transistors P4, P5 and NMOS transistors N1, N2. PMOS transistors P4, P5 are cross-coupled with NMOS transistors N1, N2.

The pull-up unit 220 includes PMOS transistors P6~P8. PMOS transistor P6 is connected between power voltage VDD terminal and a node Nsabl. PMOS transistor P7 is connected between the node Nsabl and a node Nsaref. PMOS transistor P8 is connected between power voltage VDD terminal and node Nsaref. PMOS transistors P6~P8 have a common gate to receive sense amplifier enable signal SEN.

Amplifying unit 230 includes NMOS transistors N3, N4. NMOS transistor N3 connected between node Nsabl and NMOS transistor N5, has a gate connected to a node Nbl. NMOS transistor N4, connected between the node Nsaref and NMOS transistor N5, has a gate to receive reference voltage Nref0.

Amplifying activation control unit 240, connected between amplifying unit 230 and the ground voltage GND terminal, has a gate to receive the sense amplifier enable signal SEN.

Current sensing load unit 250 includes a PMOS transistor P9. PMOS transistor P9, connected between power voltage VDD terminal and node Nbl, has a gate to receive a load voltage Vload.

Bit line voltage bias control unit 260 includes a NMOS transistor N6. NMOS transistor N6, connected between node Nbl and bit line BL, has a gate to receive clamp voltage VCLMP.

Figure 10:
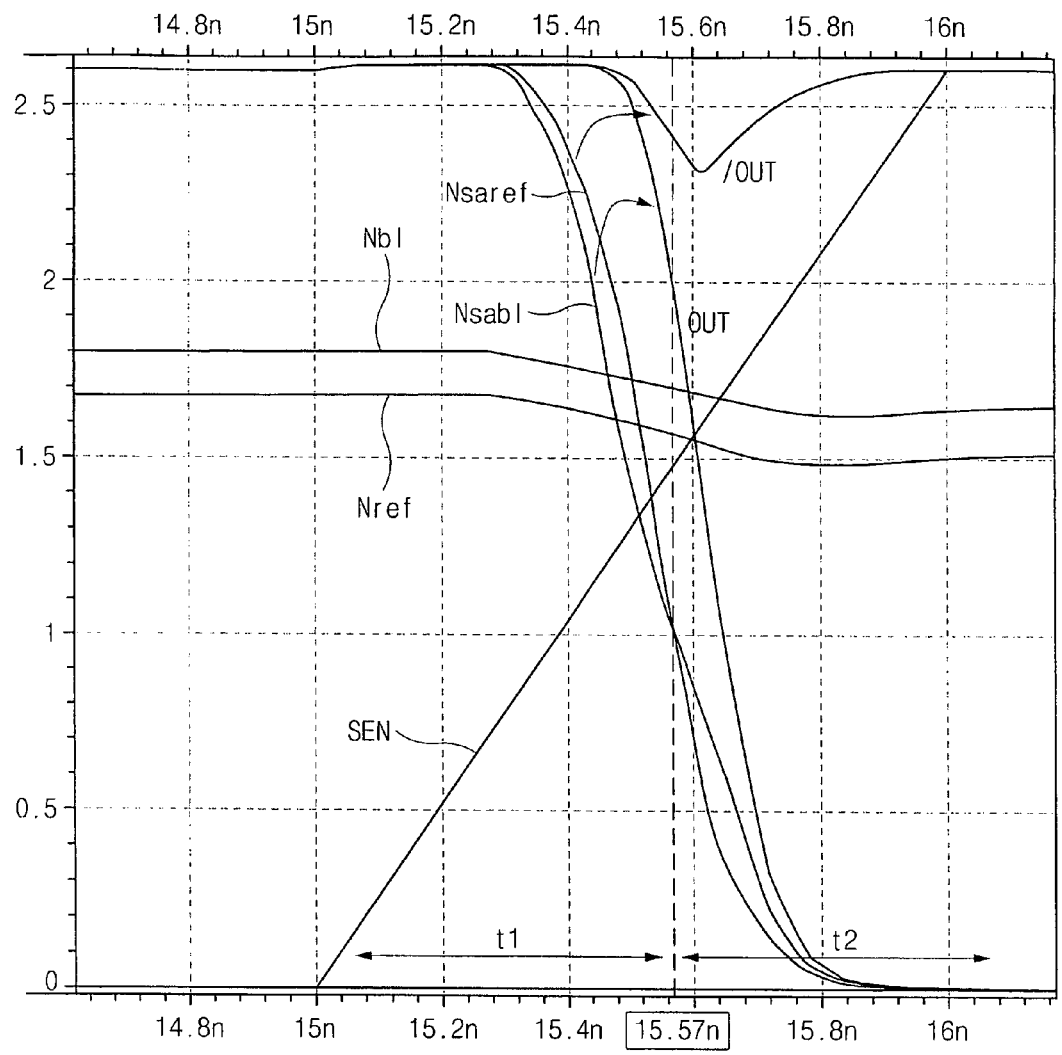
FIGS. 10 to 12 are circuit diagrams schematically-illustrating a reference voltage generating unit shown in FIGS. 5 and 6 consistent with the present invention.

FIG. 10 is a waveform diagram illustrating current sense amplifier S/A of FIG. 9.

When clamp voltage VCLMP rises, NMOS transistor N6 is turned on to transmit a bit line current of the main cell into node Nbl. A gate voltage of NMOS transistor N6 is controlled by clamp voltage VCLMP.

Current sensing load unit 250 includes a PMOS transistor P9 controlled by load voltage Vload. A current of bit line BL is converted into a sensing voltage value in the node Nbl by a load value of PMOS transistor P9.

Amplifying activation control unit 240 is controlled by sense amplifier enable signal SEN. Amplifying units 210 and 230 are activated depending on a state of the amplifying activation control unit 240. Amplifying unit 230 amplifies voltages of node Nbl and reference voltage Nref using gains of NMOS transistors N3, N4.

Both nodes Nsabl, Nsaref terminals are pre-charged to a high level depending on the operation of pull-up unit 220 during a pre-charge period. As a result, an amplifying characteristic of sense amplifier S/A is improved. That is, both nodes Nsabl, Nsaref terminals are pulled down in the period t1 to have an amplified voltage value. The voltage amplified in amplifying unit 230 is transmitted into amplifying unit 210 to improve a second amplifying unit.

Amplifying unit 210 amplifies the gains of amplifying unit 140 to improve an offset characteristic of sense amplifier S/A. Equalizing unit 200 pre-charges an output signal of amplifying unit 210 to a high level during the pre-charge period.

Figure 11:
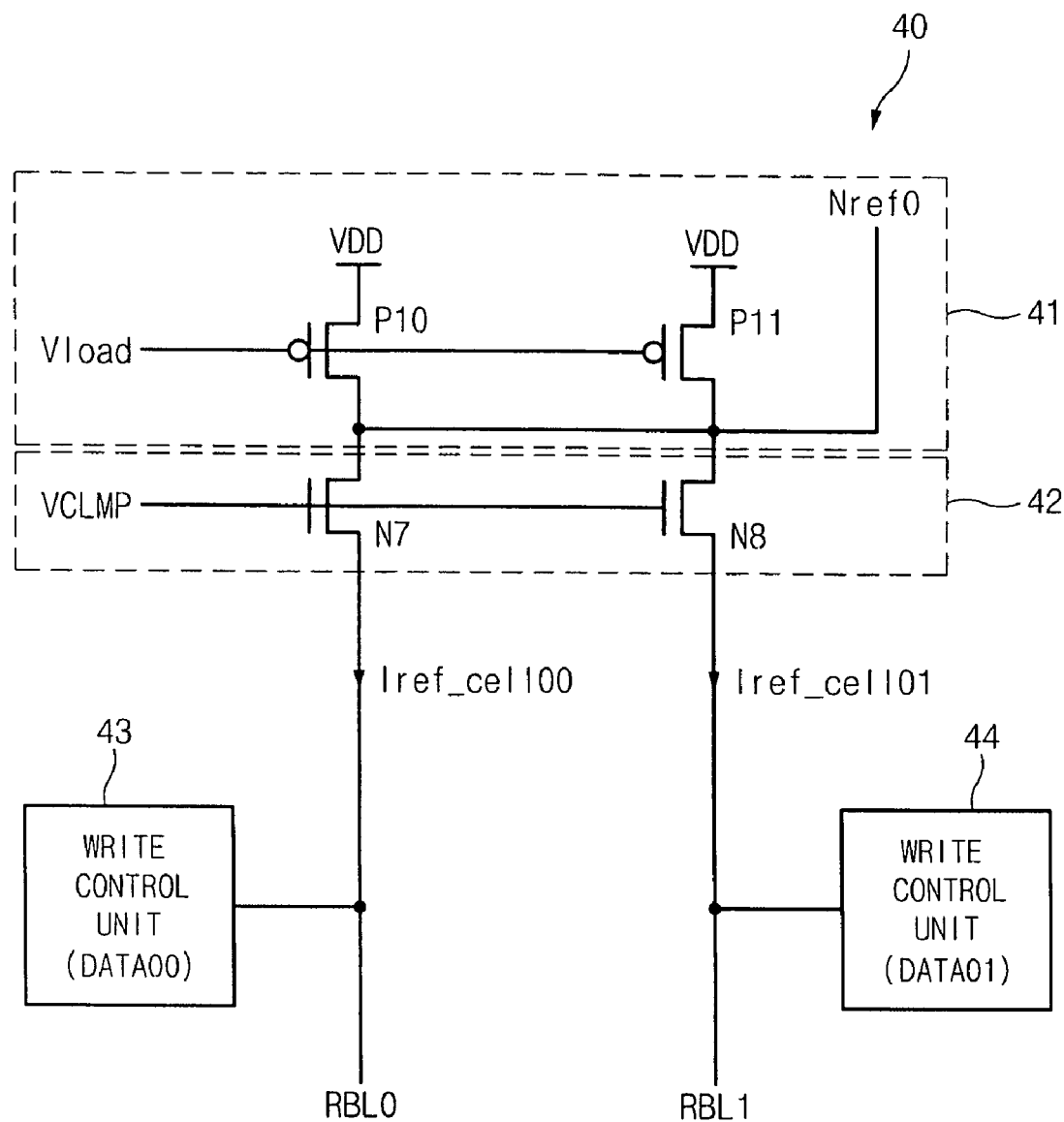
Figure 12:
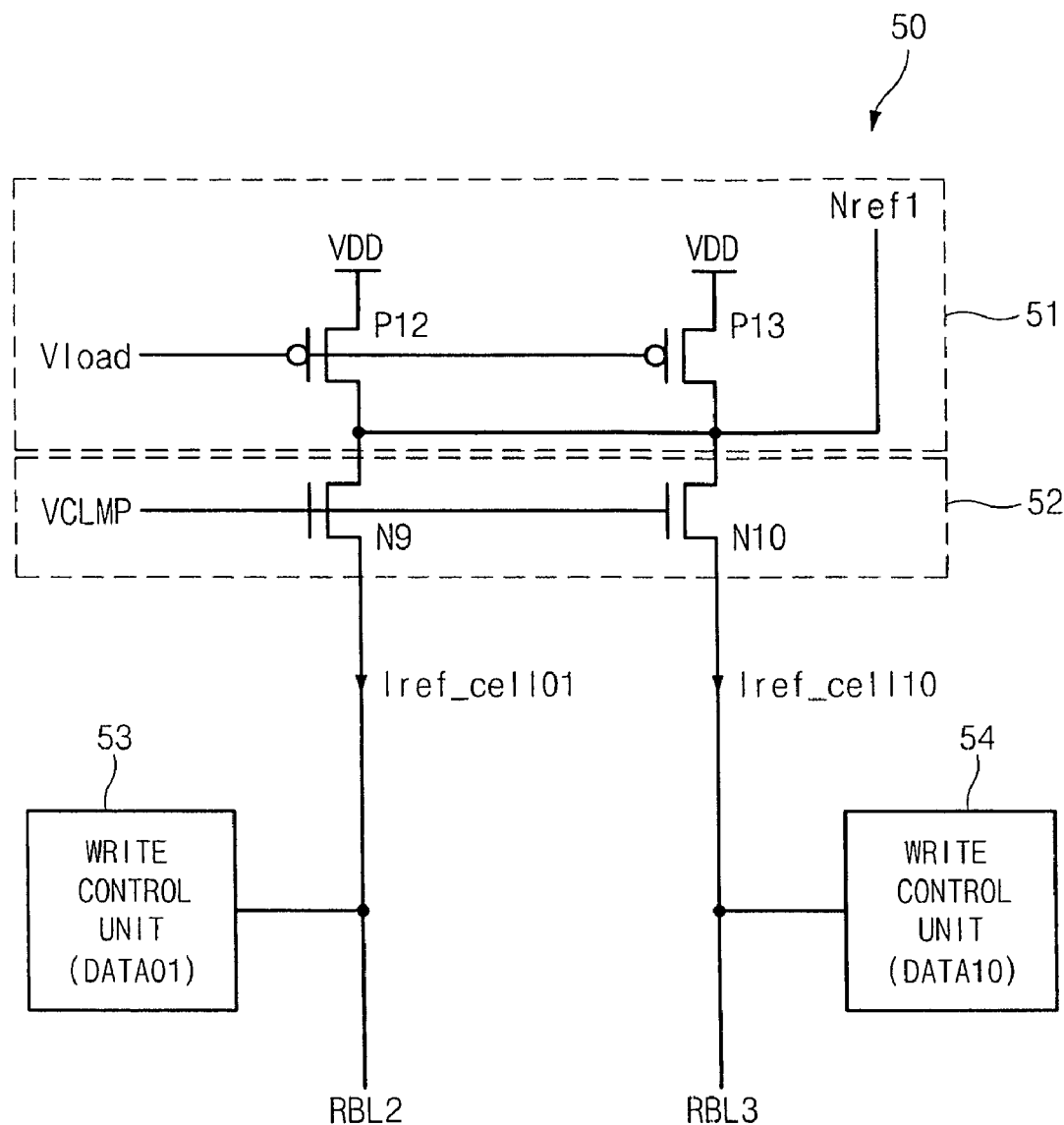
Figure 13:
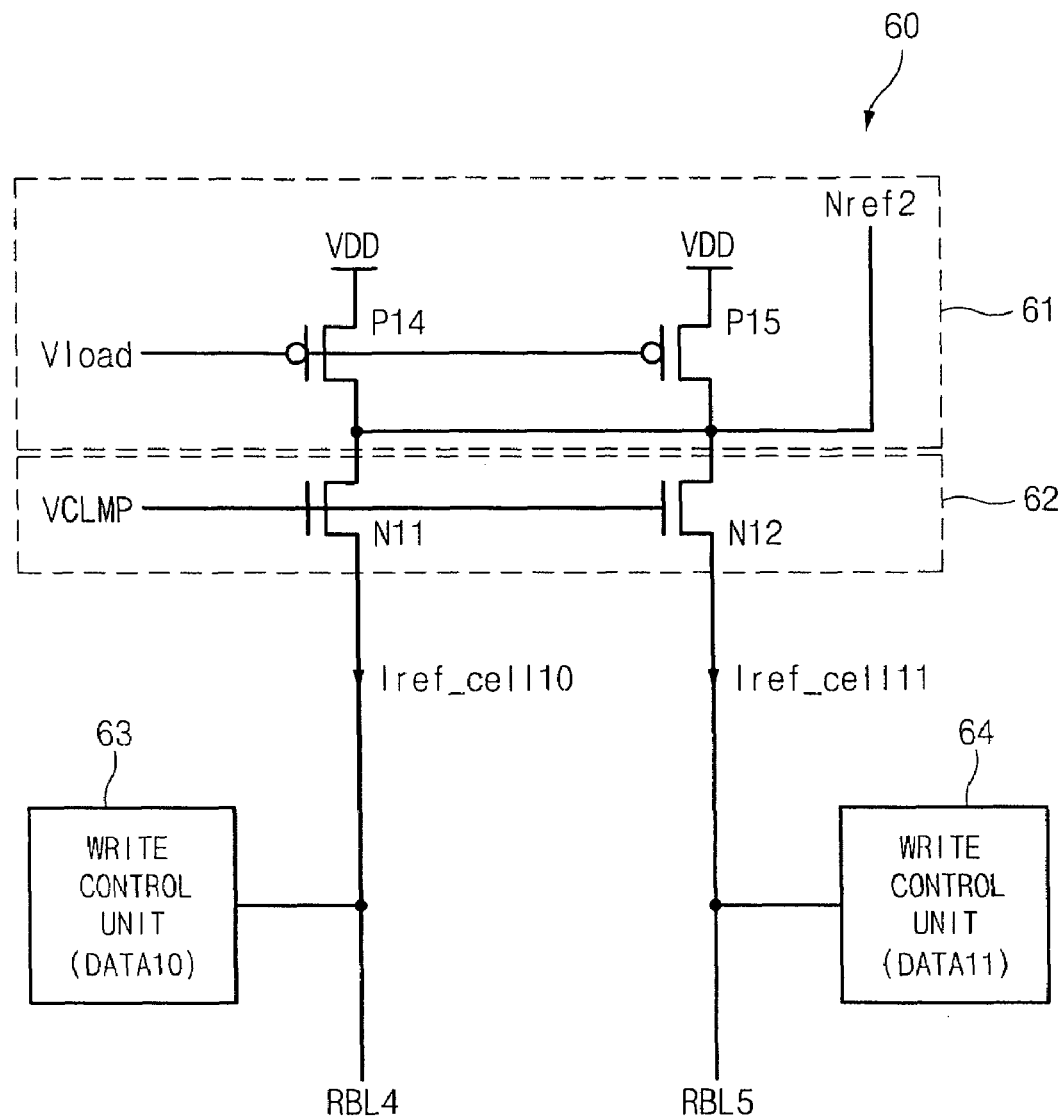
FIG. 13 is a diagram illustrating output of first and second amplifying terminals of the current sense amplifier shown in FIG. 10 consistent with the present invention.

FIGS. 11 to 13 are circuit diagrams illustrating reference voltage generating units 40 and 60 of FIGS. 5 and 6 consistent with the present invention. Reference voltage generating units 40~60 of FIG. 5 consistent with the present invention are exemplified.

FIG. 11 is a circuit diagram illustrating reference voltage generating unit 40.

Reference voltage generating unit 40 includes a current sensing load unit 41 and a bit line voltage bias control unit 42.

Current sensing load unit 41 includes PMOS transistors P10, P11. PMOS transistor P10, P11, connected between power voltage VDD terminal and reference voltage Nref0 terminal, has a common gate to receive load voltage Vload. PMOS transistors P10, P11 are set to have the same load under consideration of the size and characteristics of the current sensing load unit of the main sense amplifier.

Bit line voltage bias control unit 42 includes NMOS transistors N7, N8. NMOS transistors N7 and N8, connected between reference voltage Nref0 terminal and reference bit lines RBL0, RBL1, may have a common gate to receive clamp voltage VCLMP.

In reference voltage generating unit 40, a gate voltage of NMOS transistors N7, N8 is controlled by clamp voltage VCLMP. Reference currents Iref_cell00, Iref_cell01 are converted into a reference voltage value in reference voltage Nref0 terminal by a load value of PMOS transistors P10, P11. That is, reference current Iref0 is converted into a reference voltage Nref0 value by the average value of reference currents Iref_cell00, Iref_cell01.

A write control unit 43 for writing the data "00" under the same condition of the main cell in a write mode is connected to the reference bit line RBL0. A write control unit 44 for writing the data "01" under the same condition of the main cell in the write mode is connected to reference bit line RBL1.

FIG. 12 is a circuit diagram illustrating reference voltage generating unit 50.

Reference voltage generating unit 50 includes a current sensing load unit 51 and a bit line voltage bias control unit 52.

Current sensing load unit 51 includes PMOS transistors P12, P13. PMOS transistor P12, P13, connected between power voltage VDD terminal and the reference voltage Nref1 terminal, has a common gate to receive load voltage Vload. PMOS transistors P12, P13 are set to have the same load under consideration of the size and characteristics of the current sensing load unit of the main sense amplifier.

Bit line voltage bias control unit 52 includes NMOS transistors N9, N10. NMOS transistors N9 and N10, connected between reference voltage Nref1 terminal and reference bit lines RBL2, RBL3, has a common gate to receive clamp voltage VCLMP.

In reference voltage generating unit 50, a gate voltage of NMOS transistors N9, N10 is controlled by clamp voltage VCLMP. Reference currents Iref_cell01, Iref_cell10 are converted into a reference voltage value in reference voltage Nref1 terminal by a load value of PMOS transistors P12, P13. That is, reference current Iref1 is converted into a reference voltage Nref1 value by the average value of reference currents Iref_cell01, Iref_cell10.

A write control unit 53 for writing the data "01" under the same condition of the main cell in a write mode is connected to reference bit line RBL2. A write control unit 54 for writing the data "10" under the same condition of the main cell in the write mode is connected to reference bit line RBL3.

FIG. 13 is a circuit diagram illustrating reference voltage generating unit 60 consistent with the present invention.

Reference voltage generating unit 60 includes a current sensing load unit 61 and a bit line voltage bias control unit 62.

Current sensing load unit 61 includes PMOS transistors P14, P15. PMOS transistor P14, P15, connected between power voltage VDD terminal and reference voltage Nref2 terminal and has a common gate to receive the load voltage Vload. PMOS transistors P14, P15 are set to have the same load under consideration of the size and characteristics of the current sensing load unit of the main sense amplifier.

Bit line voltage bias control unit 62 includes NMOS transistors N11, N12. NMOS transistors N11 and N12, connected between the reference voltage Nref2 terminal and reference bit lines RBL4, RBL5, has a common gate to receive the clamp voltage VCLMP.

In the reference voltage generating unit 60, a gate voltage of NMOS transistors N11, N12 may be controlled by clamp voltage VCLMP. The reference currents Iref_cell10, Iref_cell11 may be converted into a reference voltage value in the reference voltage Nref2 terminal by a load value of PMOS transistors P14, P15. That is, the reference current Iref2 is converted into a reference voltage Nref2 value by the average value of the reference currents Iref_cell10, Iref_cell11.

A write control unit 63 for writing the data "10" under the same condition of the main cell in a write mode is connected to reference bit line RBL4. A write control unit 64 for writing the data "11" under the same condition of the main cell in the write mode is connected to reference bit line RBL5.

Figure 14:
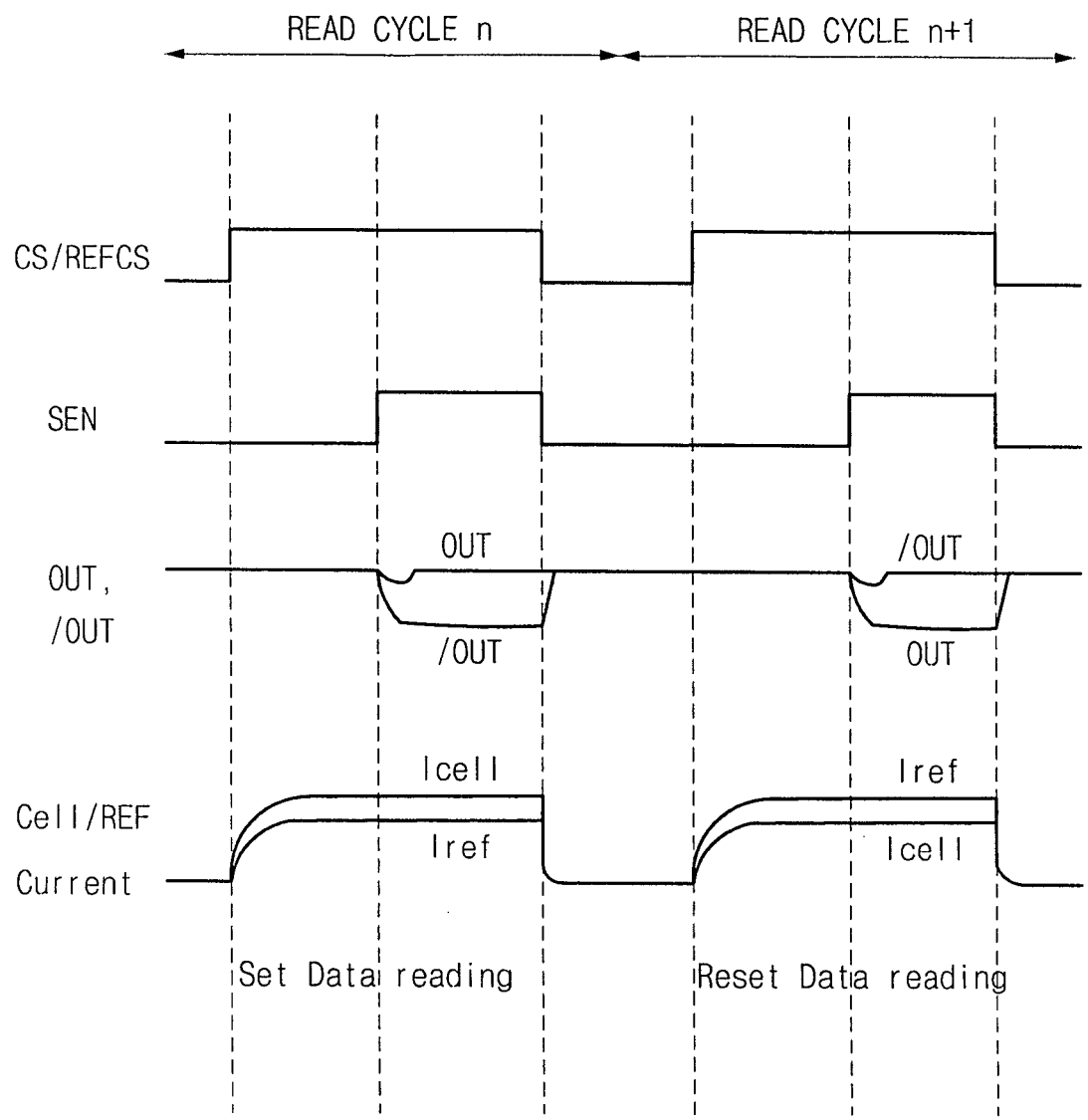
FIG. 14 is a timing diagram illustrating a process for operating the sense amplifier shown in FIG. 9 consistent with the present invention.

FIG. 14 is a timing diagram illustrating an operating voltage in the sense amplifier S/A of FIG. 9. FIG. 14 shows the current sensing operation of the data "1" and "0" in two read cycles.

In a read cycle n, when a column selecting switch CS and a reference column selecting switch REFCS are activated, a cell current and a reference REF current start to flow. After a given time, a voltage of output terminals OUT, /OUT is amplified when sense amplifier enable signal SEN is activated. Since cell current Icell is larger than reference current Iref, the output terminal OUT is outputted at a high level and the output terminal /OUT is outputted at a low level.

In a read cycle n+1, when the column selecting switch CS and the reference column selecting switch REFCS are activated, the cell current and reference REF current start to flow. After a given time, a voltage of the output terminals OUT, /OUT is amplified when sense amplifier enable signal SEN is activated. Since cell current Icell is smaller than reference current Iref, the output terminal OUT is outputted at a low level and the output terminal /OUT is outputted at a high level.

Figure 15:
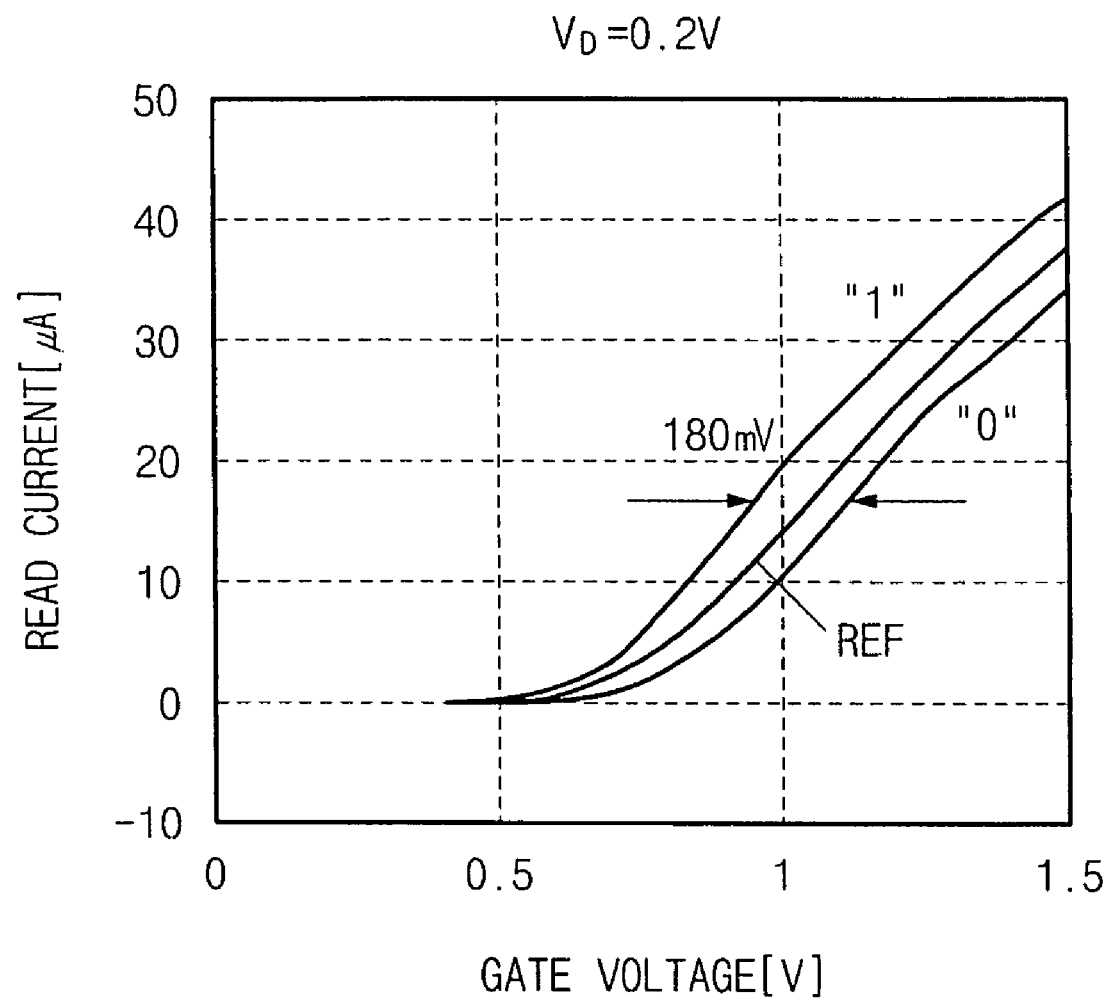
FIG. 15 is a diagram illustrating a cell read current of a one-transistor type DRAM according to an embodiment consistent with the present invention.

FIG. 15 is a waveform diagram illustrating a characteristic of a multi-level read current of a one-transistor type DRAM according to an embodiment consistent with the present invention.

The graph of FIG. 15 illustrates a cell read current when a cell gate voltage is swept while a cell drain voltage Vd is 0.2V, a cell source voltage is grounded in a DRAM cell of SOI wafer 10.

When a word line read voltage is applied to word line WL, a read current flows from bit line BL into source line SL. The data "1" is read when the amount of flowing sensing current is larger than a reference current, and the data "0" is read when it is lower than the reference current.

At the read mode, a larger amount of the sensing current flows when the data "1" is stored than when the data "0" is stored. That is, the read current is largest when the data "1" is stored, and the read current is smallest when the data "0" is stored. A reference current REF has a read current value corresponding to a middle value of the data "1" state and the data "0" state FIG. 16 is a diagram illustrating a one-transistor type DRAM according to an embodiment consistent with the present invention.

Figure 16:
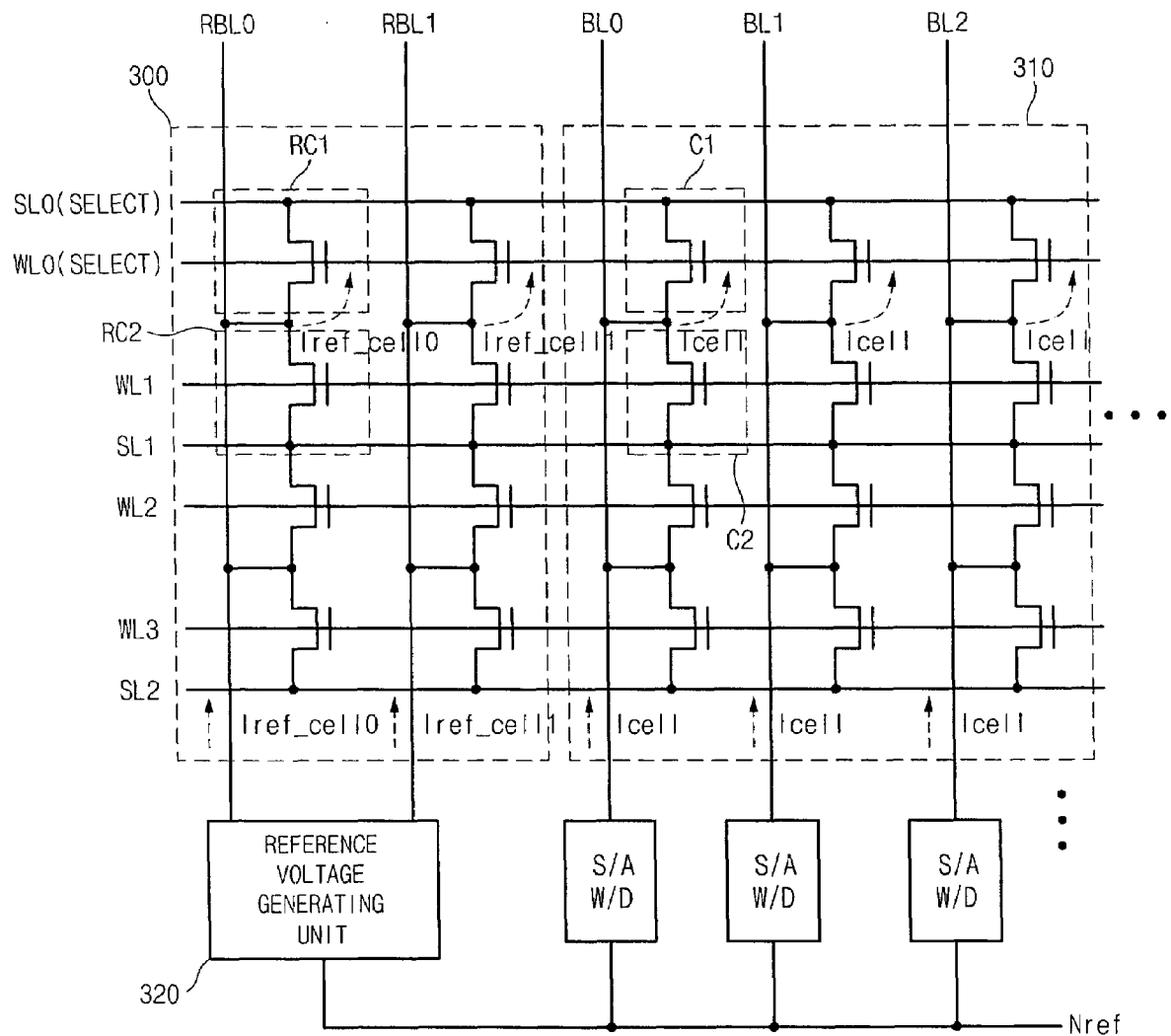
FIGS. 16 and 17 are diagrams illustrating a one-transistor type DRAM according to an embodiment consistent with the present invention.

The one-transistor type DRAM of FIG. 16 comprises a reference cell array 300, a cell array 310, a reference voltage generating unit 320, a sense amplifier S/A and a write driving unit W/D.

Reference cell array 300 includes a plurality of source lines SL0~SL2 and a plurality of word lines WL0~WL3 which are arranged in a row direction. A pair of reference bit lines RBL0, RBL1 is arranged in a column direction. Reference cell array 300 includes reference cells RC1, RC2 to generate a reference voltage Nref, thereby increasing efficiency of the sense amplifier.

In the reference cell array 300, reference cells RC1, RC2, connected between the source lines SL0 and SL1, have a common drain to share reference bit line RBL0. Reference cells RC1, RC2 have a gate connected to the word lines WL0, WL1, respectively. Reference cells RC1, RC2 arranged up and down have a source connected to the different source lines SL0, SL1.

Cells of the reference cell array 300 are paired in a row direction. That is, the reference cell is disposed based on two columns to store opposite data.

Reference cells RC1, RC2 connected to reference bit line RBL0 writes the data "0" simultaneously when data of the main cells C1, C2 are written. As a result, a reference current Iref_cell0 corresponding to the data "0" flows in the reference bit line RBL0.

The reference cells connected to reference bit line RBL1 write the data "1" simultaneously as when the data of main cells are written. As a result, a reference current Iref_cell1 corresponding to the data "1" flows in reference bit line RBL1.

Reference cell array 300 has the same cell structure in order to maintain the same characteristic as that of the main cell array 310. Also, the write timing is controlled to have the same condition. A sensing current of reference cell RC to write the data "0" is set to have the same value as that of a sensing current of the main cell to write the data "0". A sensing current of reference cell RC to write the data "1" is set to have the same value as that of a sensing current of the main cell to write the data "1".

Cell array 310 includes a plurality of source lines SL0~SL2 and a plurality of word lines WL0~WL3 arranged in a row direction. A plurality of bit lines BL0~BL2 are arranged in a column direction.

In cell array 310, cells C1, C2 connected between the source lines SL0 and SL1 have a common drain that shares bit line BL0. Gates of cells C1, C2 are connected to word lines WL0, WL1, respectively. Sources of cells C1, C2 arranged up and down are connected to the different source lines SL0, SL1.

The source line sensing voltage Vslsense, which is a sensing bias voltage for sensing a sensing current of the cell, is applied between bit line BL and source line SL. As a result, cell sensing current Icell may flow depending on a storage state of cell data.

Reference voltage generating unit 320 is connected to paired referenced bit lines RBL0, RBL1 in order to generate a reference current of the sense amplifier S/A. Reference voltage generating units 320 control reference currents Iref_cell0, Iref_cell1 flowing into paired reference bit lines RBL0, RBL1 to generate a reference voltage Nref.

Bit line BL0, BL2 are connected one-by-one to sense amplifier S/A and write driving unit W/D. The sense amplifier S/A and the write driving unit W/D receive the reference voltage Nref for distinguishing sensing voltages to control the cell current Icell.

Sense amplifier S/A senses the cell data to distinguish the data "1" from the data "0". Write driving unit W/D supplies a driving voltage corresponding to write data to bit line BL when data are written in the cell.

Figure 17:
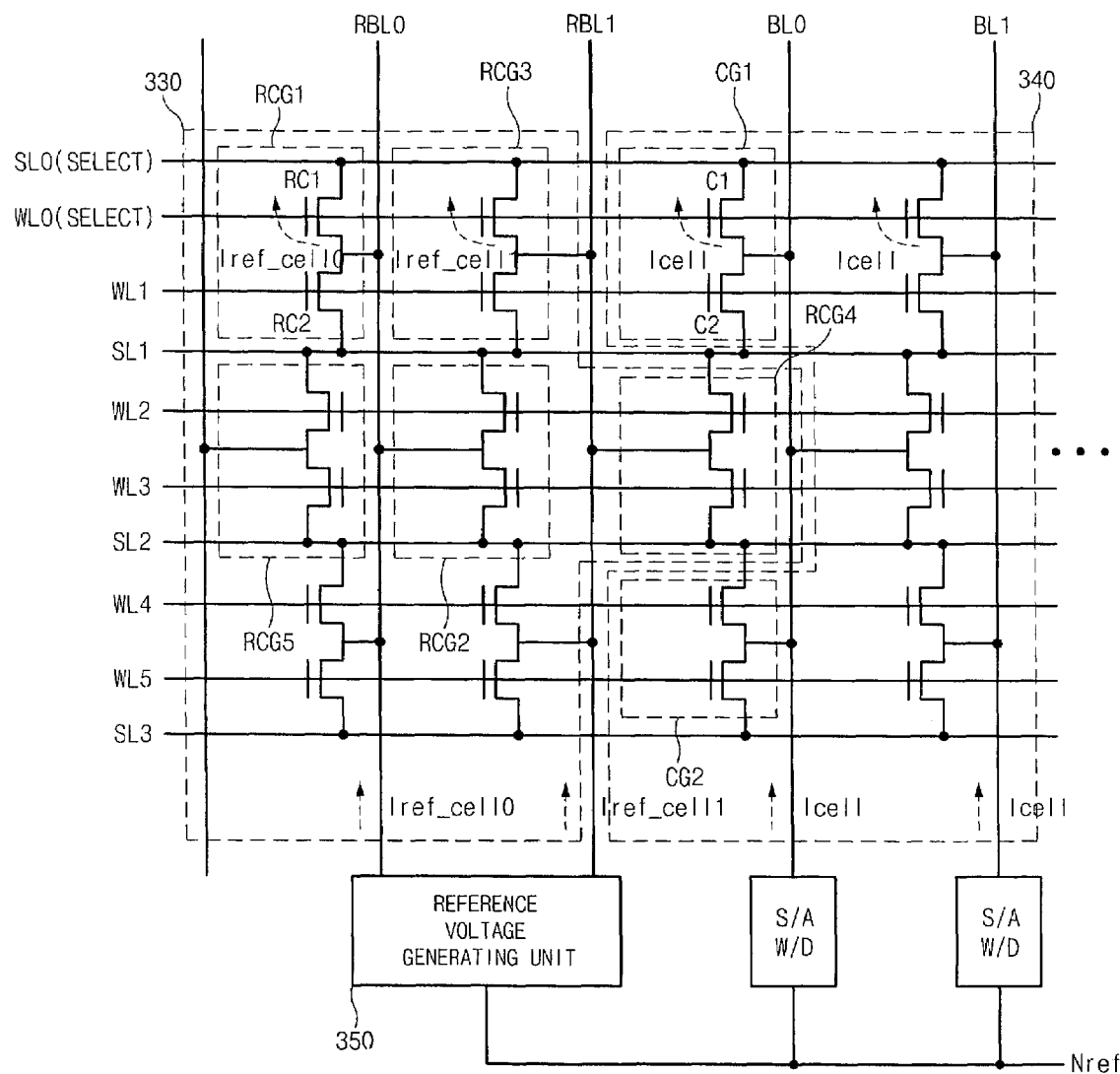

FIG. 17 is a diagram illustrating a one-transistor type DRAM according to an embodiment consistent with the present invention.

The one-transistor type DRAM of FIG. 17 comprises a reference cell array 330, a cell array 340, a reference voltage generating unit 350, a sense amplifier S/A and a write driving unit W/D.

Reference cell array 330 includes a plurality of source lines SL0~SL3 and a plurality of word lines WL0~WL5 which are arranged in a row direction. A pair of reference bit lines RBL0, RBL1 is arranged in a column direction. Reference cell array 330 includes reference cells RC1, RC2 which reflects a characteristic of main cell to generate a reference voltage Nref, thereby increasing efficiency of the sense amplifier.

In reference cell array 330, the reference cells RC1, RC2, connected between the source lines SL0 and SL1, have a common drain to share the reference bit line RBL0. Reference cells RC1, RC2 have a gate connected to word lines WL0, WL1, respectively. Reference cells RC1, RC2 arranged up and down have a source connected to the different source lines SL0, SL1.

Cells of reference cell array 330 are paired in a row direction. That is, the reference cell is disposed based on two columns to store opposite data.

Reference cells RC1, RC2 connected to reference bit line RBL0 writes the data "0" simultaneously when data of the main cells C1, C2 are written. As a result, a reference current Iref_cell0 corresponding to the data "0" flows in reference bit line RBL0.

The reference cells connected to reference bit line RBL1 write the data "1" simultaneously as when the data of main cells are written. As a result, a reference current Iref_cell1 corresponding to the data "1" flows in reference bit line RBL1.

Reference cell array 330 has the same cell structure in order to maintain the same characteristic as that of main cell array 340. Also, the write timing is controlled to have the same condition. A sensing current of reference cell RC to write the data "0" is set to have the same value as that of a sensing current of the main cell to write the data "0". A sensing current of reference cell RC to write the data "1" is set to have the same value as that of a sensing current of the main cell to write the data "1".

Cell array 340 includes a plurality of source lines SL0~SL3 and a plurality of word lines WL0~WL5 arranged in a row direction. A plurality of bit lines BL0~BL1 are arranged in a column direction.

In cell array 340, the cells C1, C2 connected between the source lines SL0 and SL1 have a common drain that shares bit line BL0. Gates of cells C1, C2 are connected to word lines WL0, WL1, respectively. Sources of cells C1, C2 arranged up and down are connected to different source lines SL0, SL1.

Source line sensing voltage Vslsense, which is a sensing bias voltage for sensing a sensing current of the cell, is applied between bit line BL and source line SL. As a result, cell sensing current Icell flows depending on a storage state of cell data.

Reference voltage generating unit 350 is connected to paired referenced bit lines RBL0, RBL1 in order to generate a reference current of sense amplifier S/A. Reference voltage generating units 350 controls reference currents Iref_cell0, Iref_cell1 flowing in paired reference bit lines RBL1, RBL2 to generate a reference voltage Nref.

Bit line BL0, BL1 are connected one-by-one to sense amplifier S/A and write driving unit W/D. Sense amplifier S/A and write driving unit W/D receive reference voltage Nref for distinguishing sensing voltages to control cell current Icell.

Sense amplifier S/A senses the cell data to distinguish the data "1" from the data "1". Write driving unit W/D supplies a driving voltage corresponding to write data to bit line BL when data are written in the cell.

Reference cell array 330 includes reference cell groups RCG1 and RCG2 connected to reference bit line RBL0 and reference cell groups RCG3 and RCG4 connected to reference bit line RBL1. Cell array 340 includes a plurality of cell groups CG1, CG2 connected to bit line BL.

Reference cell groups RCG1, RCG2 connected to reference bit line RBL0 are alternately arranged in row and column directions.

Reference cell groups RCG3, RCG4 connected to reference bit line RBL1 are alternately arranged in row and column directions. A plurality of cell groups CG1, CG2 connected to bit line BL are arranged alternately in row and column directions.

Source line SL1 is shared by reference cell groups RCG1, RCG2 arranged up and down. Reference cell groups RCG1, RCG3 arranged in the same row line and cell group CG1 are shared by source line SL1.

Reference cell groups CCG2, CCG3 arranged up and down based on source line SL1 from reference cell groups RCG2, RCG3 arranged in the same column line are connected to reference bit lines RBL0 and RBL1. That is, reference cell group RCG3 arranged over source line SL1 is connected to reference bit line RBL1, and reference cell group RCG2 arranged below source line SL1 is connected to reference bit line RBL0.

When several cells arranged up and down share the same bit line, a bias voltage is applied to bit line BL while source line SL1 is shared in a write mode. The same voltage is applied to floating body cells arranged up and down. As a result, the same bias voltage is applied to selected cells and unselected cells so that an operating error occurs in the unselected cells.

Cell groups CG3, CG2 arranged up and down are connected to reference bit lines RBL1, RBL0. The bias voltage is applied to the selected cells, and the bias voltage from the bit line is not applied in the unselected cells, thereby preventing an operating error of the cell.

A reference cell group RCG5 is not connected to clamp bit line CBL, but is disposed in the cell array to make process be convenience. A bias condition applied to each cell can be differentiated by changing the arrangement of the cell groups as shown in FIG. 17.

Figure 18:
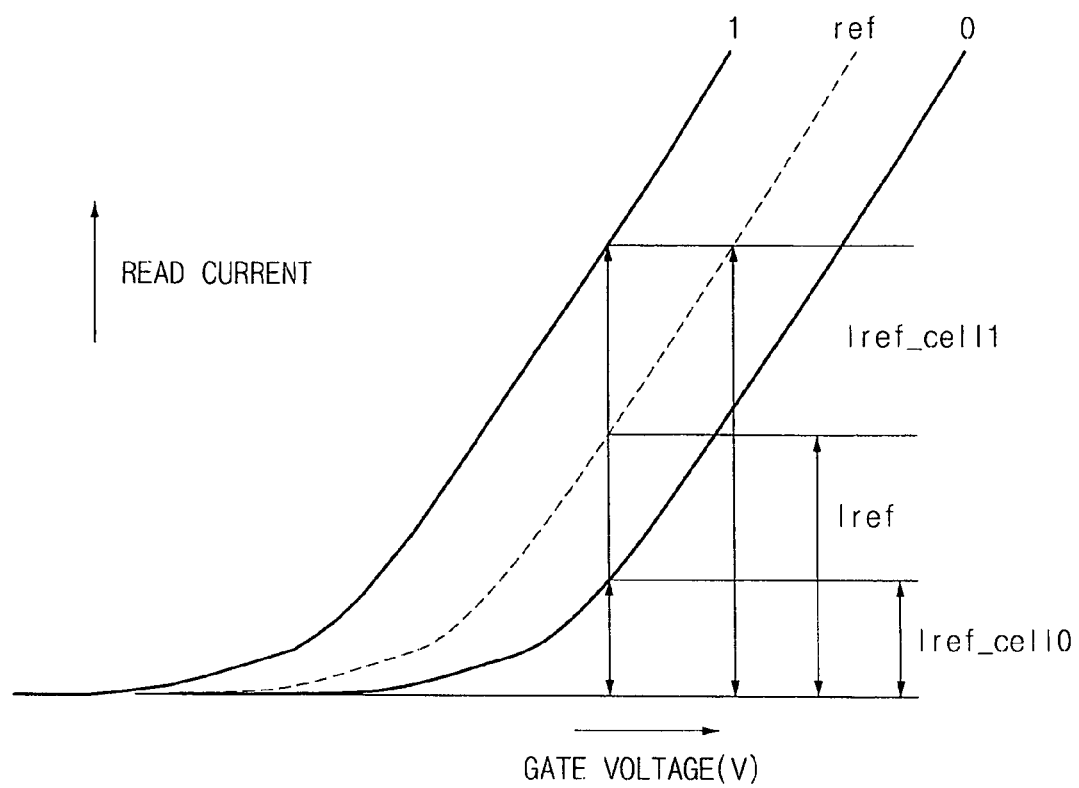
FIG. 18 is a diagram illustrating a reference current of a one-transistor type DRAM according to an embodiment consistent with the present invention.

FIG. 18 is a waveform diagram illustrating a reference current of a one-transistor type DRAM according to an embodiment consistent with the present invention.

In the period t1 of FIG. 4b, when the voltage of word line WL transits to word line sensing voltage Vwlsense level, the same reference current Iref_cell0 as a current Icell0 corresponding to the data "0" flows in reference cells RC1, RC2 connected to reference bit line RBL0.

The same reference current Iref_cell1 as a current Icell1 corresponding to the data "1" flows in the reference cells RC1, RC2 connected to the reference bit line RBL1. As a result, reference voltage generating unit 320 generates a reference current Iref having a middle value of the currents Icell0 and Icell1 of the main cell.

Values of reference currents Iref_cell0 and Iref_cell1 are averaged. In other words, the values of reference currents Iref_cell0 and Iref_cel01 are added and divided by 2. As a result, reference current Iref has a current value corresponding to the middle value of currents Icell0 and Icell1.

Figure 19:
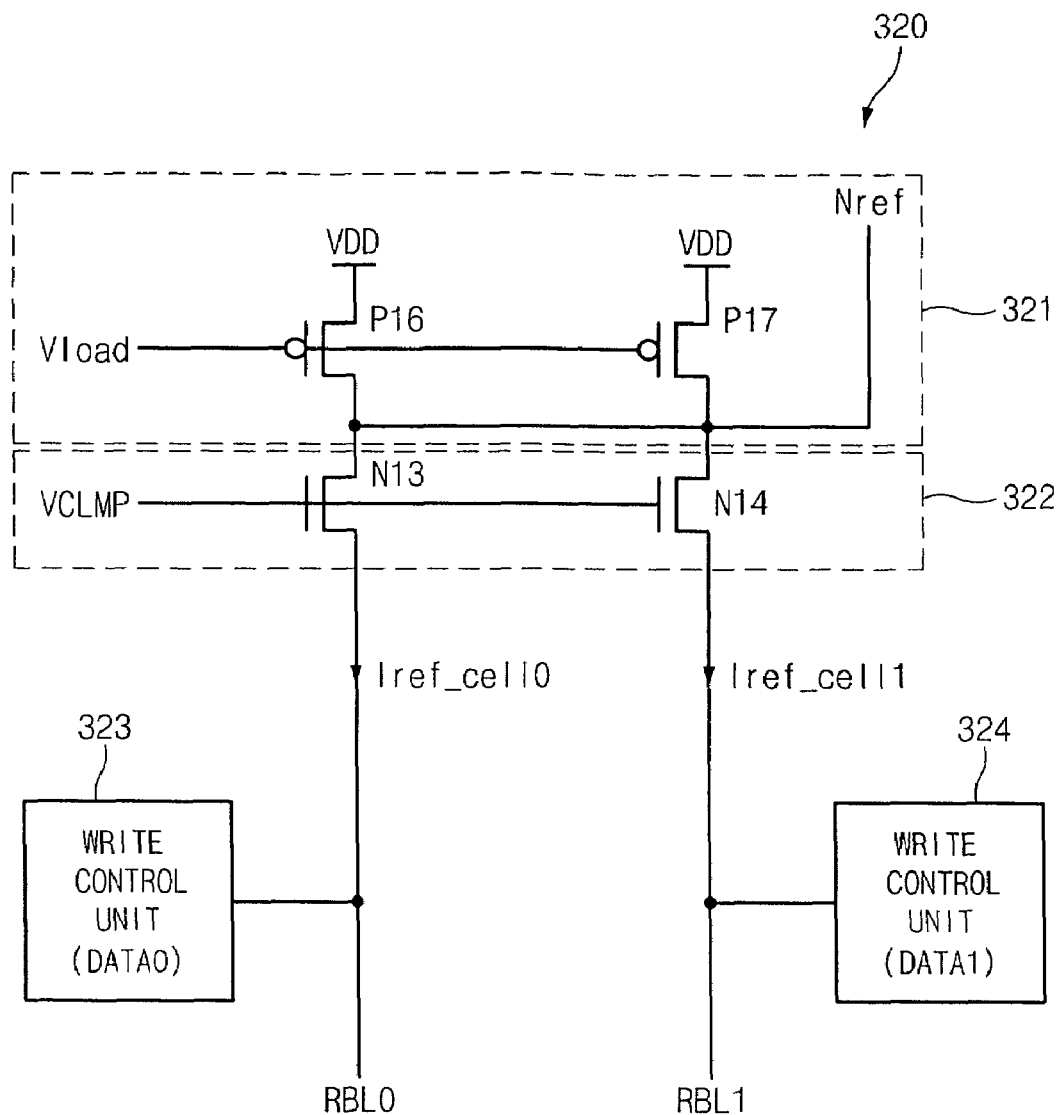
FIG. 19 is a circuit diagram schematically illustrating a reference offset current adjusting unit shown in FIGS. 16 and 17 consistent with the present invention.

FIG. 19 is a circuit diagram illustrating reference voltage generating units 320 and 350 of FIGS. 16 and 17. Reference voltage generating unit 320 of FIG. 16 is exemplified.

Reference voltage generating unit 320 includes a current sensing load unit 321 and a bit line voltage bias control unit 322.

Current sensing load unit 321 includes PMOS transistors P16, P17. PMOS transistor P16, P17, connected between power voltage VDD terminal and reference voltage Nref terminal, has a common gate to receive load voltage Vload. PMOS transistors P16, P17 are set to have the same load under consideration of the size and characteristics of the current sensing load unit of the main sense amplifier.

Bit line voltage bias control unit 322 includes NMOS transistors N13, N14. NMOS transistors N13 and N14, connected between reference voltage Nref terminal and reference bit lines RBL0, RBL1, has a common gate to receive clamp voltage VCLMP.

In the reference voltage generating unit 320, a gate voltage of the NMOS transistors N13, N14 is controlled by the clamp voltage VCLMP. Reference currents Iref_cell0, Iref_cell1 are converted into a reference voltage value in the reference voltage Nref terminal by a load value of PMOS transistors P16, P17. That is, reference current Iref is converted into a reference voltage Nref value by the average value of the reference currents Iref_cell0, Iref_cell1.

A write control unit 323 for writing the data "0" under the same condition of the main cell in a write mode may be connected to reference bit line RBL0. A write control unit 324 for writing the data "1" under the same condition of the main cell in the write mode is connected to reference bit line RBL1.

As described above, according to an embodiment consistent with the present invention, a one-transistor type DRAM includes a reference cell array with a floating body storage element to generate a reference voltage that reflects write and data retaining characteristics of a main cell to improve efficiency of a sense amplifier.

The one-transistor type DRAM includes a reference cell array with a floating body storage element to generate a reference voltage that reflects write and data retaining characteristics of a main cell to improve efficiency of a sense amplifier.

One-transistor type DRAM is configured to read/write a plurality of data.

One-transistor type DRAM is applied with a Non-Destructive Read Out (NDRO) system not to destroy cell data in a read mode, thereby improving reliability of cells.

One-transistor type DRAM may reduce the cell size. Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A one-transistor type DRAM including a floating body storage element connected between a bit line and a source line and controlled by a word line, the DRAM comprising:

a plurality of source lines and word lines arranged in a row direction;

a plurality of bit lines arranged in a column direction;

a plurality of reference bit lines arranged in the column direction;

a cell array including the floating body storage element and formed in a region where the source line, the word line and the bit line are crossed;

a reference cell array including the floating body storage element, formed in a region where the source line, the word line and the bit line are crossed and configured to output a reference current having a plurality of levels;

a plurality of reference voltage generating units connected to the reference bit lines and configured to generate a plurality of reference voltages corresponding to the reference current having a plurality of levels; and a sense amplifier and a write driving unit connected to the bit line and configured to receive the plurality of reference voltages.

2. The one-transistor type DRAM according to claim 1, wherein a pair of the reference bit lines are connected to the reference voltage generating unit.

3. The one-transistor type DRAM according to claim 1, wherein the cell array stores 2 bit data with 4 level reference currents.

4. The one-transistor type DRAM according to claim 1, wherein each cell included in the reference cell array stores different data.

5. The one-transistor type DRAM according to claim 1, wherein the cell array includes a first cell and a second cell which are connected between a first source line and a second source line and each of the first cell and the second cell configured to has a drain connected to the bit line and a gate connected to a different word line.

6. The one-transistor type DRAM according to claim 5, wherein the reference cell array includes first and second reference cells which are connected between the first source line and the second source line and each of the first cell and the second cell has a drain connected to the reference bit line and a gate connected to a different word line.

7. The one-transistor type DRAM according to claim 1, wherein the cell array includes a plurality of cell groups connected to the bit line, the cell groups including a first group connected to a first bit line and a second group connected to a second bit line.

8. The one-transistor type DRAM according to claim 7, wherein the first group and the second group are alternately arranged in row and column directions.

9. The one-transistor type DRAM according to claim 1, wherein adjacent ones of the reference voltage generating units have the same reference current value as a reference value.

10. The one-transistor type DRAM according to claim 1, wherein the reference voltage generating unit includes:

a current sensing load unit configured to control load of a first reference voltage depending on a load voltage; and a bit line voltage bias control unit configured to control the first reference voltage flowing in a first reference bit line and a second reference bit line depending on a clamp voltage.

11. A one-transistor type DRAM including a floating body storage element connected between a bit line and a source line and controlled by a word line, the DRAM comprising:

a plurality of bit lines arranged in a column direction;

a first reference bit line arranged in a column direction;

a second reference bit line arranged in a column direction;

a third reference bit line arranged in a column direction;

a fourth reference bit line arranged in a column direction;

a first reference voltage generating unit connected to the first reference bit line and the second reference bit line;

a second reference voltage generating unit connected to the third reference bit line and the fourth reference bit line; and a sense amplifier and a write driving unit connected to the plurality of bit lines and configured to receive a plurality of reference voltages, wherein the first reference voltage generating unit averages a reference current flowing in the first reference bit line and the second reference bit line to output a first reference voltage, and the second reference voltage generating unit averages a reference current flowing in the third reference bit line and the fourth reference bit line to output a second reference voltage.

* * * * *